United States Patent
Ryu et al.

(10) Patent No.: US 9,678,254 B2
(45) Date of Patent: Jun. 13, 2017

(54) RED PIXEL, GREEN PIXEL AND COLOR FILTER AND DISPLAY DEVICE

(71) Applicant: JSR Corporation, Minato-ku (JP)

(72) Inventors: Jung Ryu, Tokyo (JP); Masatsugu Ayabe, Tokyo (JP)

(73) Assignee: JSR Corporation, Minato-ku (JP)

( * ) Notice: Subject to any disclaimer, the term of this patent is extended or adjusted under 35 U.S.C. 154(b) by 178 days.

(21) Appl. No.: 14/708,763

(22) Filed: May 11, 2015

(65) Prior Publication Data

US 2015/0331165 A1    Nov. 19, 2015

(30) Foreign Application Priority Data

May 13, 2014    (JP) ................... 2014-100032

(51) Int. Cl.
| | | |
|---|---|---|
| *G02B 5/20* | (2006.01) | |
| *G03F 7/031* | (2006.01) | |
| *G02F 1/1335* | (2006.01) | |
| *G02B 5/23* | (2006.01) | |
| *G02B 1/04* | (2006.01) | |
| *F21V 8/00* | (2006.01) | |
| *G02B 5/22* | (2006.01) | |

(Continued)

(52) U.S. Cl.
CPC ............ *G02B 5/201* (2013.01); *G02B 1/04* (2013.01); *G02B 5/223* (2013.01); *G02B 5/23* (2013.01); *G02B 6/0026* (2013.01); *G02F 1/133615* (2013.01); *B82Y 20/00* (2013.01); *G02F 1/133514* (2013.01); *G02F 2001/133624* (2013.01); *G02F 2202/36* (2013.01); *G03F 7/0007* (2013.01)

(58) Field of Classification Search
CPC ....... G03F 7/0007; G02B 5/201; G02B 5/223; G02B 6/0026; G02F 1/133514; G02F 2001/133624; G02F 2202/36; B82Y 20/00
USPC .............................................. 430/7; 349/106
See application file for complete search history.

(56) References Cited

U.S. PATENT DOCUMENTS 8,049,844 B2    11/2011  Okutsu et al.
2008/0079873 A1*  4/2008  Utsumi ............ G02F 1/133514
                                                        349/106

(Continued)

FOREIGN PATENT DOCUMENTS

| JP | 2010-128310 | 6/2010 |
|---|---|---|
| WO | WO 2007/102386 A1 | 9/2007 |
| WO | WO 2015/045735 A1 * | 4/2015 |

OTHER PUBLICATIONS

Computer-generated translation of JP 2015-069142 (Apr. 2015).*

*Primary Examiner* — John A McPherson
(74) *Attorney, Agent, or Firm* — Oblon, McClelland, Maier & Neustadt, L.L.P.

(57) ABSTRACT

A red pixel has a chromaticity coordinate in the CIE colorimetric system in use by a light emitting element containing quantum dots as a light source, satisfying $0.670 \leq x \leq 0.680$, and a film thickness of 3.0 μm or less. A green pixel has a chromaticity coordinate in the CIE colorimetric system in use by the light emitting element as a light source, satisfying $0.690 \leq x \leq 0.710$, and a film thickness of 3.0 μm or less. The color filter has at least one of the red pixel and the green pixel. A display device comprises a color filter having at least one of the red pixel and the green pixel, and the light emitting element containing quantum dots.

5 Claims, 4 Drawing Sheets

(51) Int. Cl.
 *G03F 7/00* (2006.01)
 *B82Y 20/00* (2011.01)

(56) References Cited

U.S. PATENT DOCUMENTS

| | | | |
|---|---|---|---|
| 2011/0156575 A1* | 6/2011 | Yu | B82Y 20/00 |
| | | | 313/503 |
| 2013/0021560 A1* | 1/2013 | Wang | G02F 1/133603 |
| | | | 349/69 |
| 2016/0154276 A1* | 6/2016 | Saitoh | G02B 5/201 |
| | | | 349/61 |

* cited by examiner

RED PIXEL, GREEN PIXEL AND COLOR FILTER AND DISPLAY DEVICE

CROSS-REFERENCE TO THE RELATED APPLICATION

The entire disclosure of the Japanese Patent Application No. 2014-100032, filed on May 13, 2014 including specification, claims, drawings, and summary, on which the Convention priority of the present application is based, are incorporated herein in its entirety.

FIELD OF THE INVENTION

The present invention relates to a red pixel, a green pixel and a color filter and a display device.

Color liquid crystal display devices are used for various applications including personal computer (PC) monitors, cellular phone displays, laptop PCs, personal digital assistants, and televisions because of their advantages, such as low power consumption and space saving.

As a light source of a backlight provided in a color liquid crystal display device, cold cathode fluorescent lamps (CCFLs) have previously been used, however recently there has been much interest in white LEDs from the perspective of environmental protection and energy saving. WO 2007/102386 A proposes a color filter including a red pixel containing C. I. Pigment Red 177, C. I. Pigment Red 179, C. I. Pigment Red 254, or the like, and a color filter including a green pixel containing C. I. Pigment Green 7, C. I. Pigment Green 36, C. I. Pigment Yellow 150, C. I. Pigment Yellow 185, or the like, as color filters suitable for a liquid crystal display device using a white LED as a light source. JP 2010-128310 A proposes a color filter including a red pixel containing C. I. Pigment Red 264, C. I. Pigment Red 208, or the like, as a color filter to be used for a liquid crystal display device using a white LED as a light source.

Furthermore, in recent years, there has been much interest in quantum dots as a material with which further energy saving and enlargement of a color gamut, and the use thereof for light sources is under investigation. However, no proper combination of quantum dots as a solid light source with a color filter has been reported.

Accordingly, a problem to be solved by the present invention is to provide a red pixel and a green pixel each suitable for a display device using a light emitting element containing quantum dots as a light source. Another problem to be solved by the present invention is to provide a color filter suitable for a display device using a light emitting element containing quantum dots as a light source. Still another problem to be solved by the present invention is to provide a display device including the above-mentioned color filter.

As a result of earnest studies, the present inventors have proven that the above-described problems can be solved by using the red and green pixels in a color filter according to the present invention.

SUMMARY OF THE INVENTION

According to one aspect of the present invention, a red pixel to be used for a display device including a light emitting element containing quantum dots. The red pixel has a chromaticity coordinate in the CIE colorimetric system in use by the light emitting element containing quantum dots as a light source, the chromaticity coordinate satisfying $0.670 \leq x \leq 0.680$. The red pixel has a film thickness of 3.0 μm or less.

According to another aspect of the present invention, a green pixel to be used for a display device including a light emitting element containing quantum dots. The green pixel has a chromaticity coordinate in the CIE colorimetric system in use by the light emitting element containing quantum dots as a light source, the chromaticity coordinate satisfying $0.690 \leq y \leq 0.710$. The green pixel has a film thickness of 3.0 μm or less.

According to another aspect of the present invention, a color filter to be used for a display device including a light emitting element containing quantum dots. The color filter includes at least one of, a red pixel that has a chromaticity coordinate in the CIE colorimetric system in use by the light emitting element containing quantum dots as a light source, the chromaticity coordinate satisfying $0.670 \leq x \leq 0.680$, and a film thickness of 3.0 μm or less, and a green pixel that has a chromaticity coordinate in the CIE colorimetric system in use by the light emitting element containing quantum dots as a light source, the chromaticity coordinate satisfying $0.690 \leq y \leq 0.710$, and a film thickness of 3.0 μm or less.

According to another aspect of the present invention, a display device includes, a color filter having at least one of, a red pixel that has a chromaticity coordinate in the CIE colorimetric system in use by a light emitting element containing quantum dots as a light source, the chromaticity coordinate satisfying $0.670 \leq x \leq 0.680$, and a film thickness of 3.0 μm or less, and a green pixel that has a chromaticity coordinate in the CIE colorimetric system in use by the light emitting element containing quantum dots as a light source, the chromaticity coordinate satisfying $0.690 \leq y \leq 0.710$, and a film thickness of 3.0 μm or less, and the light emitting element containing quantum dots.

DETAILED DESCRIPTION OF THE EMBODIMENT

Figure 1:
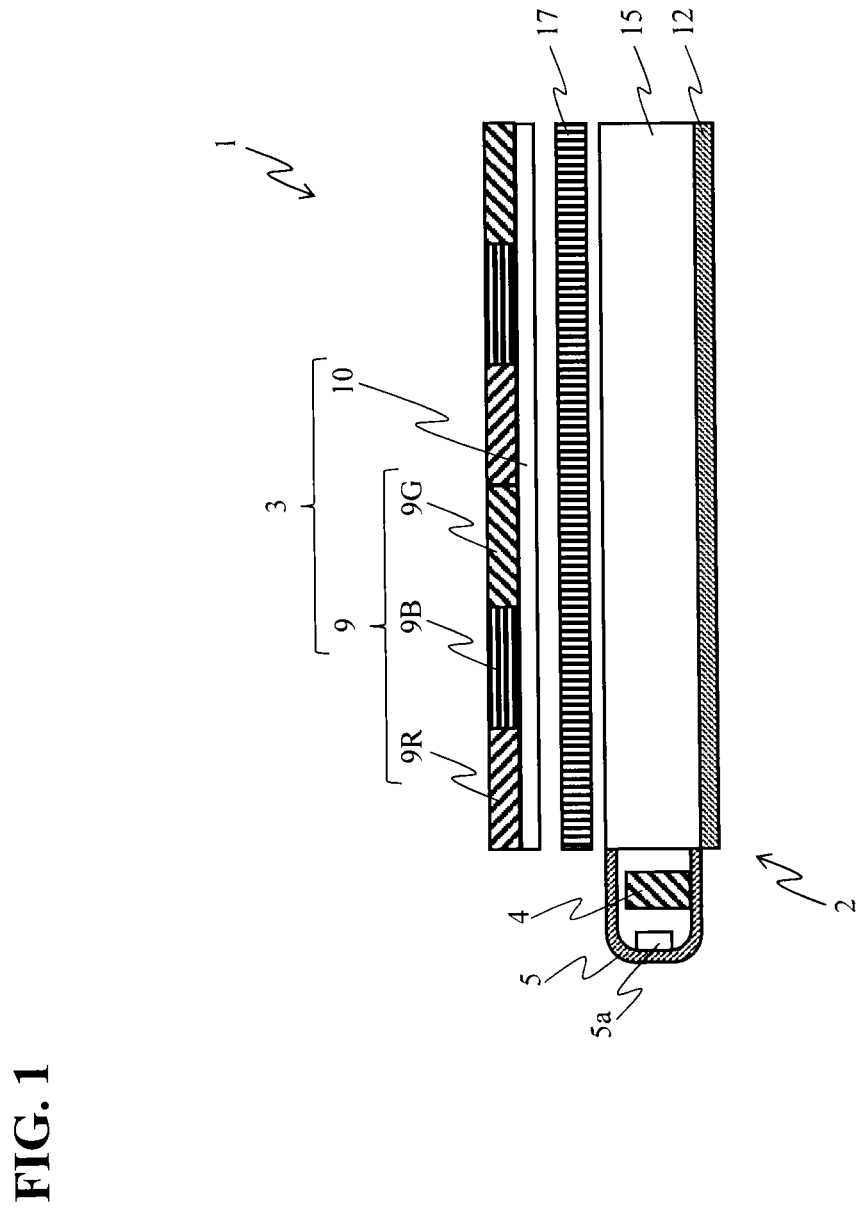
FIG. 1 is a cross sectional diagram schematically showing the first example of the display device of the present invention.

The present embodiment will be described in detail below.
Color Filter
The color filter of the present invention has at least one of the red pixels of the present invention and the green pixels of the present invention, both described below.

Hereafter, a description is made to pixels of each color to constitute a color filter.
—Red Pixel—
The red pixel of the present invention is required to have a film thickness of 3.0 μm or less. This makes it possible to make the display device of the present invention into a thinner film. The film thickness of the red pixel is preferably up to 2.9 μm, more preferably up to 2.7 μm, even more preferably up to 2.5 μm, and particularly preferably up to 2.4 μm.

In the red pixel of the present invention it is required that the chromaticity coordinate, in the CIE colorimetric system in use by the light emitting element containing quantum dots as a light source, satisfies 0.670≤x≤0.680. The light emitting element containing quantum dots will be described in detail in the section of display device provided below.

The red pixel of the present invention can be formed using a publicly known red colorant composition including a red colorant, a binder resin, a polymerizable compound, etc.

While the red colorant is not particularly restricted and the color and the material thereof may be chosen appropriately, at least one selected from pigments and dyes is preferred as the red colorant because color filters are required to be high in color purity, brilliance, contrast, and so on; particularly, organic pigments and organic dyes are preferable.

Examples of the organic pigments include compounds categorized as pigment in the Color Index (C. I.; published by The Society of Dyers and Colourists), namely, the ones given the following Color Index (C. I.) numbers.

C. I. Pigment Red 1, C. I. Pigment Red 2, C. I. Pigment Red 5, C. I. Pigment Red 17, C. I. Pigment Red 31, C. I. Pigment Red 32, C. I. Pigment Red 41, C. I. Pigment Red 48:1, C. I. Pigment Red 48:2, C. I. Pigment Red 48:3, Pigment Red 48:4, C. I. Pigment Red 48:5, C. I. Pigment Red 49, C. I. Pigment Red 49:1, C. I. Pigment Red 49:2, C. I. Pigment Red 49:3, C. I. Pigment Red 52:1, C. I. Pigment Red 52:2, C. I. Pigment Red 53:1, C. I. Pigment Red 54, C. I. Pigment Red 57:1, C. I. Pigment Red 58, C. I. Pigment Red 58:1, C. I. Pigment Red 58:2, C. I. Pigment Red 58:3, C. I. Pigment Red 58:4, C. I. Pigment Red 60:1, C. I. Pigment Red 63, C. I. Pigment Red 63:1, C. I. Pigment Red 63:2, C. I. Pigment Red 63:3, C. I. Pigment Red 64:1, C. I. Pigment Red 68, C. I. Pigment Red 81, C. I. Pigment Red 81:1, C. I. Pigment Red 122, C. I. Pigment Red 123, C. I. Pigment Red 144, C. I. Pigment Red 149, C. I. Pigment Red 166, C. I. Pigment Red 168, C. I. Pigment Red 170, C. I. Pigment Red 171, C. I. Pigment Red 175, C. I. Pigment Red 176, C. I. Pigment Red 177, C. I. Pigment Red 178, C. I. Pigment Red 179, C. I. Pigment Red 180, C. I. Pigment Red 185, C. I. Pigment Red 187, C. I. Pigment Red 200, C. I. Pigment Red 202, C. I. Pigment Red 206, C. I. Pigment Red 207, C. I. Pigment Red 209, C. I. Pigment Red 214, C. I. Pigment Red 220, C. I. Pigment Red 221, C. I. Pigment Red 224, C. I. Pigment Red 237, C. I. Pigment Red 239, C. I. Pigment Red 242, C. I. Pigment Red 243, C. I. Pigment Red 247, C. I. Pigment Red 254, C. I. Pigment Red 255, C. I. Pigment Red 262, C. I. Pigment Red 264, C. I. Pigment Red 272.

Examples of the organic dyes include xanthene compounds, triarylmethane compounds, cyanine compounds, anthraquinone compounds, and dipyrromethene compounds. Specific examples include, in addition to the compounds categorized as dyes in the Color Index (C. I.; published by The Society of Dyers and Colourists); compounds disclosed in JP 2010-032999 A, JP 2010-254964 A, JP 2010-254965 A, JP 2013-011869 A, JP 2013-050693 A, JP 2013-116956 A, JP 2013-116957 A and JP 2013-210621 A as the xanthene compound; compounds disclosed in JP 2011-070171 A, WO 2011-152379, JP 2012-017425 A, WO 2012-036085, WO 2012-053201 etc. as the triarylmethane compound; compounds disclosed in JP 2009-235392 A, KR 2011-0079198 A, JP 2013-173850 A etc. as the cyanine compound; compounds disclosed in JP 2008-015530 A, JP 2013-210621 A etc. as the anthraquinone compound; and compounds disclosed in JP 2008-083416 A, JP 2011-174036 A, JP 2012-041330 A, JP 2012-077026 A, JP 2012-140586 A, JP 2012-177037 A etc. as the dipyrromethene compound.

It is especially preferred, from the perspective of enabling reduction in thickness of the red pixel, that the red pixel of the present invention contains at least one selected from the group consisting of pigments having a diketopyrrolopyrrole skeleton, C. I. Pigment Red 242, C. I. Pigment Red 166, and cyanine compounds as a red colorant. More preferred are C. I. Pigment Red 242, C. I. Pigment Red 166, and cyanine compounds, and even more preferred are C. I. Pigment Red 242 and C. I. Pigment Red 166. C. I. Pigment Red 242 is particularly preferred from the perspective of the brilliance of the red pixel, and C. I. Pigment Red 166 is particularly preferred from the perspective of contrast and film thickness.

As a pigment having a diketopyrrolopyrrole skeleton, besides C. I. Pigment Red 254, C. I. Pigment Red 255 and C. I. Pigment Red 264, compounds represented by the following formula (1) also can be used; above all, C. I. Pigment Red 254 and the compounds represented by the following formula (1) are preferred.

[Chemical Formula 1]

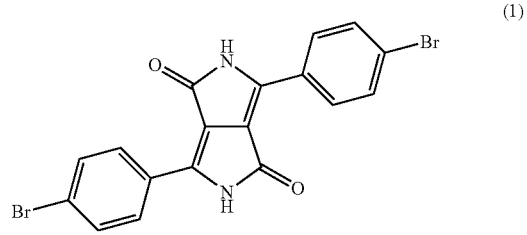

(1)

The red pixel may contain a colorant other than red colorants, and it is particularly preferred that the red pixel contains a yellow colorant.

Examples of a yellow pigments include C. I. Pigment Yellow 12, C. I. Pigment Yellow 13, C. I. Pigment Yellow 14, C. I. Pigment Yellow 17, C. I. Pigment Yellow 20, C. I. Pigment Yellow 24, C. I. Pigment Yellow 31, C. I. Pigment Yellow 55, C. I. Pigment Yellow 61, C. I. Pigment Yellow 61:1, C. I. Pigment Yellow 62, C. I. Pigment Yellow 83, C. I. Pigment Yellow 93, C. I. Pigment Yellow 100, C. I. Pigment Yellow 104, C. I. Pigment Yellow 109, C. I. Pigment Yellow 110, C. I. Pigment Yellow 129, C. I. Pigment Yellow 133, C. I. Pigment Yellow 138, C. I. Pigment Yellow 139, C. I. Pigment Yellow 150, C. I. Pigment Yellow 153, C. I. Pigment Yellow 154, C. I. Pigment Yellow 155, C. I. Pigment Yellow 166, C. I. Pigment Yellow 168, C. I. Pigment Yellow 169, C. I. Pigment Yellow 180, C. I. Pigment Yellow 183, C. I. Pigment Yellow 185, C. I. Pigment Yellow 191, C. I. Pigment Yellow 191:1, C. I. Pigment Yellow 206, C. I. Pigment Yellow 209, C. I. Pigment Yellow 209:1, C. I. Pigment Yellow 211, C. I. Pigment Yellow 212, C. I. Pigment Yellow 215 etc.

Examples of a yellow dye include anthraquinone compounds, azo compounds, azomethine compounds, and quinophthalone compounds. Specific examples include, in addition to the compounds categorized as dyes in the Color Index (C. I.; published by The Society of Dyers and Colourists); compounds disclosed in JP 2007-041050 A, JP 2007-041076 A, JP 2007-308643 A, JP 2009-067748 A, JP 2010-150416 A, JP 2010-152159 A, JP 2010-152160 A, JP 2010-170073 A, JP 2010-170074 A, JP 2011-016974 A, JP 2011-074270 A, JP 2012-062461 A, WO2012-039361 etc. as the azo compound; compounds disclosed in JP 2005-189802 A, JP 2006-058700 A, as the quinophthalone compound disclosed in JP 2006-126651 A, JP 2006-126649 A, JP 2006-133508 A, JP 2010-250291 A, JP 2013-209614 A etc as the azomethine compound. Those listed above can be provided as anthraquinone compounds.

C. I. Pigment Yellow 129 and C. I. Pigment Yellow 150 are particularly preferred as the yellow colorant.

In a red colored composition to be used for the formation of the red pixel, the content of the colorant in the solid of the colored composition is usually 5 to 70% by mass, preferably 10 to 60% by mass, more preferably 20 to 50% by mass, and particularly preferably 30 to 50% by mass when forming a red pixel that is high in brilliance and excellent in color purity even if being in a thin film. The solid as referred to herein means components other than the solvent described below.

Colorants other than the red colorant and the yellow colorant, and other components constituting the red colored composition, such as the binder resin and the polymerizable compound, will be described below.

—Green Pixel—

The green pixel of the present invention is required to have a film thickness of 3.0 µM or less. This makes it possible to make the display device of the present invention into a thinner film. The film thickness of the green pixel is preferably up to 2.9 µm, more preferably up to 2.7 µm, even more preferably up to 2.5 µm, and particularly preferably up to 2.4 µm.

In the green pixel of the present invention it is required that the chromaticity coordinate, in the CIE colorimetric system in use by the light emitting element containing quantum dots as a light source, satisfies $0.690 \leq y \leq 0.710$. The light emitting element containing quantum dots will be described in detail in the section of display device provided below.

The green pixel of the present invention can be formed using a publicly known green colored composition including a green colorant, a binder resin, a polymerizable compound, etc.

While the green colorant is not particularly restricted and the color and the material thereof may be chosen appropriately, at least one selected from pigments and dyes is preferred as the green colorant because color filters are required to be high in color purity, brilliance, contrast, and so on; particularly, organic pigments and organic dyes are preferred.

Examples of the organic pigments include C. I. Pigment Green 1, C. I. Pigment Green 4, C. I. Pigment Green 7, C. I. Pigment Green 36, C. I. Pigment Green 58, C. I. Pigment Green 59.

Examples of a Green dye include phthalocyanine compounds etc. Specific examples include, in addition to the compounds categorized as dyes in the Color Index (C. I.; published by The Society of Dyers and Colourists), compounds disclosed in JP 2013-181141 A, JP 2013-181142 A etc.

It is preferable that the green pixel of the present invention contains at least one selected from the group consisting of halogenated copper phthalocyanine pigments and halogenated zinc phthalocyanine pigments as a green colorant. It is especially preferred, to enable reduction in thickness of the green pixel, that the green pixel of the present invention contains halogenated copper phthalocyanine pigment. As a halogenated copper phthalocyanine pigment, C. I. Pigment Green 7 and C. I. Pigment Green 36 can be used, and especially, C. I. Pigment Green 7 is preferred.

The green pixel may contain a colorant other than green colorants, and particularly it is preferred that the green pixel preferably contains a yellow colorant.

Those listed above can be provided as a yellow pigments and a yellow dye.

C. I. Pigment Yellow 139, C. I. Pigment Yellow 180, and C. I. Pigment Yellow 185 are especially preferred as the yellow colorant. C. I. Pigment Yellow 180 is more preferable from the perspective of the brilliance of the green pixel. On the other hand, from the perspective of the film thickness, C. I. Pigment Yellow 139 and C. I. Pigment Yellow 185 as an isoindoline pigment are preferred, and C. I. Pigment Yellow 185 is more preferred.

In a green colored composition to be used for the formation of the green pixel, the content of the colorant in the solid of the colored composition is usually 5 to 70% by mass, preferably 10 to 60% by mass, more preferably 20 to 50% by mass, and particularly preferably 30 to 50% by mass from the perspective of forming a green pixel that is high in brilliance and excellent in color purity even if being in a thin film.

Colorants other than the green colorant and the yellow colorant, and other components constituting the green colored composition, such as the binder resin and the polymerizable compound, will be described below.

—Blue Pixel—

Usually, the color filter of the present invention also includes a blue pixel.

While the film thickness of the blue pixel is not particularly limited, the film thickness of the blue pixel is preferably up to 3.0 µm, more preferably up to 2.8 µm, even more preferably up to 2.7 µm, and particularly preferably up to 2.6 µm from the perspective of reducing the film thickness of a color filter and a display device.

The blue pixel of the present invention can be formed using a publicly known blue colored composition including at least one colorant selected from the group consisting of blue colorants and purple colorants, a binder resin, a polymerizable compound, etc.

While the blue colorant is not particularly restricted as a colorant and the color and the material thereof may be chosen appropriately, at least one colorant selected from pigments and dyes is preferred as the blue colorant because color filters are required to be high in color purity, brilliance, contrast, and so on; particularly, organic pigments and organic dyes are preferred.

Examples of the organic pigments include C. I. Pigment Blue 1, C. I. Pigment Blue 2, C. I. Pigment Blue 3, C. I. Pigment Blue 9, C. I. Pigment Blue 10, C. I. Pigment Blue 14, C. I. Pigment Blue 15, C. I. Pigment Blue 15:3, C. I. Pigment Blue 15:4, C. I. Pigment Blue 15:6, C. I. Pigment Blue 16, C. I. Pigment Blue 17:1, C. I. Pigment Blue 24, C. I. Pigment Blue 24:1, C. I. Pigment Blue 56, C. I. Pigment Blue 60, C. I. Pigment Blue 61, C. I. Pigment Blue 62, C. I. Pigment Blue 80 etc. as the blue pigments;

C. I. Pigment Violet 1, C. I. Pigment Violet 2, C. I. Pigment Violet 3, C. I. Pigment Violet 3:1, C. I. Pigment Violet 3:3, C. I. Pigment Violet 19, C. I. Pigment Violet 23, C. I. Pigment Violet 27, C. I. Pigment Violet 29, C. I. Pigment Violet 32, C. I. Pigment Violet 36, C. I. Pigment Violet 38, C. I. Pigment Violet 39 etc. as the violet pigments.

Examples of the organic dyes include xanthene compounds, triarylmethane compounds, and cyanine compounds. Specifically, those listed above can be provided as examples thereof.

It is especially preferred, from the perspective of enabling reduction in thickness of the color filter, that C. I. Pigment Blue 15:6, C. I. Pigment Blue 16, and C. I. Pigment Violet 23 as a colored composition. Most preferable are C. I. Pigment Blue 15:6, and C. I. Pigment Blue 16.

In the blue colored composition to be used for the formation of the blue pixel, the content of the colorant in the solid of the colored composition is usually 5 to 70% by mass, preferably 10 to 50% by mass, more preferably 15 to 40% by mass, and particularly preferably 15 to 30% by mass from the perspective of forming a blue pixel that is high in brilliance and excellent in color purity.

The blue pixel may contain a colorant other than blue colorants and purple colorants. Such other colorants and other components constituting the blue colored composition, such as the binder resin and the polymerizable compound, will be described below.

—Colorant—

Examples of colorants except the above-mentioned red colorants, yellow colorants, green colorants and blue colorants which are optionally contained in the red pixel, the green pixel, and the blue pixel include C. I. Pigment Orange 5, C. I. Pigment Orange 13, C. I. Pigment Orange 14, C. I. Pigment Orange 24, C. I. Pigment Orange 34, C. I. Pigment Orange 36, C. I. Pigment Orange 38, C. I. Pigment Orange 40, C. I. Pigment Orange 43, C. I. Pigment Orange 46, C. I. Pigment Orange 49, C. I. Pigment Orange 61, C. I. Pigment Orange 64, C. I. Pigment Orange 68, C. I. Pigment Orange 70, C. I. Pigment Orange 71, C. I. Pigment Orange 72, C. I. Pigment Orange 73, C. I. Pigment Orange 74;

C. I. Pigment Brown 23, C. I. Pigment Brown 25;

C. I. Pigment Black 1, C. I. Pigment Black 7, and a lake pigment mentioned in JP 2001-081348 A, JP 2010-026334 A, JP 2010-191304 A, JP 2010-237384 A, JP 2010-237569 A, JP 2011-006602 A, JP 2011-145346 A.

In the present invention, a pigment may be purified for use by a recrystallization method, a reprecipitation method, a solvent rinsing method, a sublimation method, a vacuum heating method, or a combination thereof. The pigment may be used with its particle surface having been modified with a resin, if desired. Examples of the resin for modifying the particle surface of the pigment include the vehicle resins disclosed in JP 2001-108817 A or various types of commercially available resins for pigment dispersion. As a method for coating the surface of carbon black with a resin, the methods disclosed in JP 9-71733 A, JP 9-95625 A, and JP 9-124969 A, can be adopted, for example. Preferably, an organic pigment is used after fining primary particles by so-called salt milling. As a method of salt milling, the method disclosed in JP 8-179111 A can be adopted, for example.

Moreover, in the present invention, a publicly known dispersant and a dispersion aid may further be included together with a pigment. Examples of such a publicly known dispersant include urethane-based dispersants, polyethyleneimine-based dispersants, polyoxyethylene alkyl ether-based dispersants, polyoxyethylene alkyl phenyl ether-based dispersants, polyethylene glycol diester-based dispersants, sorbitan fatty acid ester-based dispersants, polyester-based dispersants, and acrylic dispersants, and examples of the dispersion aid include pigment derivatives.

Such dispersants are commercially available; examples of the acrylic dispersants include Disperbyk-2000, Disperbyk-2001, BYK-LPN6919, and BYK-LPN21116 (produced by BYK Chemie GmbH), examples of the urethane-based dispersants include Disperbyk-161, Disperbyk-162, Disperbyk-165, Disperbyk-167, Disperbyk-170, Disperbyk-182 (produced by BYK Chemie GmbH), and Solsperse 76500 (produced by Lubrizol Corp.), examples of the polyethyl-eneimine-based dispersants include Solsperse 24000 (produced by Lubrizol Corp.), and examples of the polyester-based dispersants include Ajisper PB-821, Ajisper PB-822, Ajisper PB-880, and Ajisper PB-881 (produced by Ajinomoto Fine-Techno Co., Inc.). In addition, BYK-LPN21324 (produced by BYK Chemie GmbH) may also be used.

Specific examples of the aforementioned pigment derivatives include copper phthalocyanine, diketopyrrolopyrrole, and sulfonic acid derivatives of quinophthalone.

—Binder Resin—

While the binder resin to constitute the red, green, and blue colored compositions is not particularly restricted, a resin having an acidic functional group such as a carboxyl group and a phenolic hydroxyl group is preferable. Above all, a polymer having a carboxyl group (hereinafter also referred to as "carboxyl group-containing polymer") is preferable and examples thereof include a copolymer of an ethylenically unsaturated monomer having one or more carboxyl groups (hereinafter also referred to as "unsaturated monomer (b1)") with another copolymerizable ethylenically unsaturated monomer (hereinafter also referred to as "unsaturated monomer (b2)").

Examples of the unsaturated monomer (b1) include (meth)acrylic acid, maleic acid, maleic anhydride, mono[2-(meth)acryloyloxyethyl]succinate, ω-carboxypolycaprolactone mono(meth)acrylate, and p-vinylbenzoic acid.

Such unsaturated monomers (b1) may be used singly or as a mixture of two or more.

Examples of the unsaturated monomer (b2) include:
N-substituted maleimides such as N-phenylmaleimide and N-cyclohexylmaleimide;

aromatic vinyl compounds such as styrene, α-methylstyrene, p-hydroxystyrene, p-hydroxy-α-methylstyrene, p-vinylbenzyl glycidyl ether, and acenaphthylene;

(meth)acrylates such as methyl(meth)acrylate, n-butyl (meth)acrylate, 2-ethylhexyl(meth)acrylate, 2-hydroxyethyl (meth)acrylate, allyl(meth)acrylate, benzyl(meth)acrylate, polyethylene glycol (degree of polymerization: 2 to 10) methyl ether(meth)acrylate, polypropylene glycol (degree of polymerization: 2 to 10) methyl ether(meth)acrylate, polyethylene glycol (degree of polymerization: 2 to 10) mono (meth)acrylate, polypropylene glycol (degree of polymerization: 2 to 10) mono(meth)acrylate, cyclohexyl(meth) acrylate, isobornyl(meth)acrylate, tricyclo[5.2.1.0$^{2.6}$]decan-8-yl(meth)acrylate, dicyclopentenyl(meth)acrylate, glycerol mono(meth)acrylate, 4-hydroxyphenyl(meth)acrylate, ethylene oxide-modified paracumylphenol(meth)acrylate, glycidyl(meth)acrylate, 3,4-epoxycyclohexylmethyl(meth) acrylate, 3-[(meth)acryloyloxymethyl]oxethane, 3-[(meth) acryloyloxymethyl]-3-ethyloxethane;

vinyl ethers such as cyclohexyl vinyl ether, isobornyl vinyl ether, tricyclo[5.2.1.0$^{2.6}$]decan-8-yl vinyl ether, pentacyclopentadecanyl vinyl ether, and 3-(vinyloxymethyl)-3-ethyloxethane;

macromonomers having a mono(meth)acryloyl group on a terminal of a polymer molecule chain such as polystyrene, polymethyl(meth)acrylate, poly-n-butyl(meth)acrylate, and polysiloxane.

Such unsaturated monomers (b2) may be used singly or as a mixture of two or more.

In the copolymer of the unsaturated monomer (b1) with the unsaturated monomer (b2), the copolymerization ratio of the unsaturated monomer (b1) in the copolymer is preferably 5 to 50% by mass and more preferably 10 to 40% by mass. By copolymerizing the unsaturated monomer (b1) within such a range, a colored composition excellent in alkali developability and storage stability can be obtained.

Specific examples of the unsaturated monomer (b1) with the unsaturated monomer (b2) include the copolymers disclosed in JP 7-140654 A, JP 8-259876 A, JP 10-31308 A, JP 10-300922 A, JP 11-174224 A, JP 11-258415 A, JP 2000-56118 A, JP 2004-101728 A, etc.

In the present invention, carboxyl group-containing polymers having a polymerizable unsaturated bond such as a (meth)acryloyl group on a side chain as disclosed in, for example, JP 5-19467 A, JP 6-230212 A, JP 7-207211 A, JP 9-325494 A, JP 11-140144 A, JP 2008-181095 A, etc. may be used as the binder resin.

The binder resin in the present invention usually has a polystyrene-equivalent weight average molecular weight (Mw) measured by gel permeation chromatography (hereinafter abbreviated as GPC) (eluting solvent: tetrahydrofuran) of 1,000 to 100,000, and preferably 3,000 to 50,000. By use of such a binder resin, it is possible to further improve the retention ratio of a coating film, a pattern shape, heat resistance, electric properties, and resolution and suppress at a high level the generation of dry foreign matter during application.

The ratio (Mw/Mn) of the weight average molecular weight (Mw) to the number average molecular weight (Mn) of the binder resin in the present invention is preferably 1.0 to 5.0, and more preferably 1.0 to 3.0. The Mn as referred to herein means a polystyrene-equivalent number average molecular weight measured by GPC (eluting solvent: tetrahydrofuran).

While the binder resin in the present invention can be produced by a publicly known method, the structure, the Mw, and the Mw/Mn thereof can be controlled by the methods disclosed, for example, in JP 2003-222717 A, JP 2006-259680 A, WO 07-029871 etc.

In the present invention, binder resins may be used singly or as a mixture of two or more.

In the present invention, the content of the binder resin is usually 10 to 1,000 parts by mass, preferably 20 to 500 parts by mass, and more preferably 30 to 200 parts by mass, relative to 100 parts by mass of the colorant. By use of such a content of the binder resin, it is possible to improve alkali developability, storage stability of a colored composition, a pattern shape, and chromatic properties in addition to further improvement in coloring power and brightness.

—Polymerizable Compound—

The polymerizable compound constituting the red, green or blue colored composition refers to a compound having two or more polymerizable groups. Examples of the polymerizable group include ethylenically unsaturated groups, an oxiranyl group, an oxetanyl group, and an N-alkoxymethylamino group. In the present invention, preferred as the polymerizable compound is a compound having two or more (meth)acryloyl groups or a compound having two or more N-alkoxymethylamino groups.

Specific examples of the compound having two or more (meth)acryloyl groups include a polyfunctional (meth)acrylate obtained by reacting an aliphatic polyhydroxy compound with (meth)acrylic acid, a caprolactone-modified polyfunctional (meth)acrylate, an alkylene oxide-modified polyfunctional (meth)acrylate, a polyfunctional urethane (meth)acrylate obtained by reacting a (meth)acrylate having a hydroxyl group with a polyfunctional isocyanate, and a polyfunctional (meth)acrylate having a carboxyl group obtained by reacting a (meth)acrylate having a hydroxyl group with an acid anhydride.

Examples of the aliphatic polyhydroxy compound include divalent aliphatic polyhydroxy compounds such as ethylene glycol, propylene glycol, polyethylene glycol, and polypropylene glycol; and tri- or more valent aliphatic polyhydroxy compounds such as glycerin, trimethylolpropane, pentaerythritol, and dipentaerythritol. Examples of the (meth)acrylate having a hydroxyl group include 2-hydroxyethyl (meth)acrylate, trimethylolpropanedi(meth)acrylate, pentaerythritol tri(meth)acrylate, dipentaerythritol penta(meth)acrylate, and glycerol dimethacrylate. Examples of the polyfunctional isocyanate include tolylene diisocyanate, hexamethylene diisocyanate, diphenylmethylene diisocyanate, and isophorone diisocyanate. Examples of the acid anhydride include dibasic acid anhydrides such as succinic anhydride, maleic anhydride, glutaric anhydride, itaconic anhydride, phthalic anhydride, and hexahydrophthalic anhydride; and tetrabasic acid dianhydrides such as pyromellitic dianhydride, biphenyltetracarboxylic dianhydride, and benzophenonetetracarboxylic dianhydride.

Examples of the caprolactone-modified polyfunctional (meth)acrylate include the compounds disclosed in paragraphs [0015] to [0018] of JP 11-44955 A. Examples of the alkylene oxide-modified polyfunctional (meth)acrylate include bisphenol A di(meth)acrylate modified with at least one selected from ethylene oxide and propylene oxide, isocyanuric acid tri(meth)acrylate modified with at least one selected from ethylene oxide and propylene oxide, trimethylolpropane(meth)acrylate modified with at least one selected from ethylene oxide and propylene oxide, pentaerythritol tri(meth)acrylate modified with at least one selected from ethylene oxide and propylene oxide, pentaerythritol tetra(meth)acrylate modified with at least one selected from ethylene oxide and propylene oxide, dipentaerythritol penta(meth)acrylate modified with at least one selected from ethylene oxide and propylene oxide, and dipentaerythritol hexa(meth)acrylate modified with at least one selected from ethylene oxide and propylene oxide.

Examples of the compound having two or more N-alkoxymethylamino groups include compounds having a melamine structure, a benzoguanamine structure, or a urea structure. The melamine structure and the benzoguanamine structure refer to chemical structures having one or more triazine rings or phenyl-substituted triazine rings as a base skeleton and are concepts also encompassing melamine, benzoguanamine, or a condensate thereof. Specific examples of the compound having two or more N-alkoxymethylamino groups include N,N,N',N',N'',N''-hexa(alkoxymethyl)melamine, N,N,N',N'-tetra(alkoxymethyl)benzoguanamine, and N,N,N',N'-tetra(alkoxymethyl)glycoluril.

Of these polymerizable compounds, preferred are the polyfunctional (meth)acrylate obtained by reacting a tri- or more valent aliphatic polyhydroxy compound with (meth)acrylic acid, the caprolactone-modified polyfunctional (meth)acrylate, the polyfunctional urethane(meth)acrylate, the polyfunctional (meth)acrylate having a carboxyl group, N,N,N',N',N'',N''-hexa(alkoxymethyl)melamine, and N,N,N',N'-tetra(alkoxymethyl)benzoguanamine. Of polyfunctional (meth)acrylates obtained by reacting a tri- or more valent aliphatic polyhydroxy compound with (meth)acrylic acid, trimethylolpropane triacrylate, pentaerythritol triacrylate, dipentaerythritol pentaacrylate, and dipentaerythritol hexaacrylate are particularly preferred, and of polyfunctional (meth)acrylates having a carboxyl group, a compound obtained by reacting pentaerythritol triacrylate with succinic anhydride and a compound obtained by reacting dipentaerythritol pentaacrylate with succinic anhydride are particularly preferable in that the strength of the colored layer is high, the colored layer is excellent in surface smoothness, and greasing, film retention, and the like are less prone to occur on the substrate of an unexposed portion and the shielding layer.

In the present invention, such polymerizable compounds may be used singly or as a mixture of two or more.

The content of the polymerizable compound in the present invention is preferably 10 to 1,000 parts by mass, more preferably 20 to 500 parts by mass, and preferably 30 to 200 parts by mass relative to 100 parts by mass of the colorant. By use of such a content of the polymerizable compound, curability and alkali developability are further improved, coloring power and brightness are further improved, and occurrence of greasing, film retention, and the like on the substrate of an unexposed portion and the shielding layer can be suppressed at a high level.

—Photopolymerization Initiator—

The red, green and blue colored compositions are allowed to contain a photopolymerization initiator. This can impart radiation sensitivity to the colored compositions. The photopolymerization initiator to be used for the present invention is a compound that generates an active species capable of starting the polymerization of the polymerizable compound upon exposure to radioactive rays such as visible rays, ultraviolet rays, far-ultraviolet rays, electron beams, and X-rays.

Examples of such a photopolymerization initiator include thioxanthone compounds, acetophenone compounds, biimidazole compounds, triazine compounds, O-acyloxime compounds, onium salt compounds, benzoin compounds, benzophenone compounds, α-diketone compounds, polynuclear quinone compounds, diazo compounds, and imidosulfonate compounds.

In the present invention, photopolymerization initiators may be used singly or as a mixture of two or more. As the photopolymerization initiator, at least one selected from the group consisting of thioxanthone compounds, acetophenone compounds, biimidazole compounds, triazine compounds, and O-acyloxime compounds is preferred.

Of photopolymerization initiators preferable in the present invention, specific examples of thioxanthone compounds include thioxanthone, 2-chlorothioxanthone, 2-methylthioxanthone, 2-isopropylthioxanthone, 4-isopropylthioxanthone, 2,4-dichlorothioxanthone, 2,4-dimethylthioxanthone, 2,4-diethylthioxanthone, and 2,4-diisopropylthioxanthone.

Specific examples of the acetophenone compounds include 2-methyl-1-[4-(methylthio)phenyl]-2-morpholinopropan-1-one, 2-benzyl-2-dimethylamino-1-(4-morpholinophenyl)butan-1-one, and 2-(4-methylbenzyl)-2-(dimethylamino)-1-(4-morpholinophenyl)butan-1-one.

Specific examples of the biimidazole compounds include 2,2'-bis(2-chlorophenyl)-4,4',5,5'-tetraphenyl-1,2'-biimidazole, 2,2'-bis(2,4-dichlorophenyl)-4,4'-5,5'-tetraphenyl-1,2'-biimidazole, and 2,2'-bis(2,4,6-trichlorophenyl)-4,4',5,5'-tetraphenyl-1,2'-biimidazole.

When a biimidazole compound is used as a photopolymerization initiator, use of a hydrogen donor together is preferred from the perspective of capability of improvement of sensitivity. The "hydrogen donor" referred to herein means a compound capable of donating a hydrogen atom to a radical generated from a biimidazole compound by exposure to light. Examples of the hydrogen donor include mercaptan hydrogen donors such as 2-mercaptobenzothiazole and 2-mercaptobenzoxazole, and amine hydrogen donors such as 4,4'-bis(dimethylamino)benzophenone and 4,4'-bis(diethylamino)benzophenone. While hydrogen donors may be used singly or as a mixture of two or more in the present invention, use of one or more mercaptan hydrogen donors and one or more amine hydrogen donors in combination is preferable in that sensitivity can be improved more.

Specific examples of the triazine compounds include triazine compounds having a halomethyl group such as 2,4,6-tris(trichloromethyl)-s-triazine, 2-methyl-4,6-bis(trichloromethyl)-s-triazine, 2-[2-(5-methylfuran-2-yl)ethenyl]-4,6-bis(trichloromethyl)-s-triazine, 2-[2-(furan-2-yl)ethenyl]-4,6-bis(trichloromethyl)-s-triazine, 2-[2-(4-diethylamino-2-methylphenyl)ethenyl]-4,6-bis(trichloromethyl)-s-triazine, 2-[2-(3,4-dimethoxyphenyl)ethenyl]-4,6-bis(trichloromethyl)-s-triazine, 2-(4-methoxyphenyl)-4,6-bis(trichloromethyl)-s-triazine, 2-(4-ethoxystyryl)-4,6-bis(trichloromethyl)-s-triazine, 2-(4-n-butoxyphenyl)-4,6-bis(trichloromethyl)-s-triazine.

Specific examples of the O-acyloxime compounds include 1,2-octanedione, 1-[4-(phenylthio)phenyl]-, 2-(O-benzoyloxime), ethanone, 1-[9-ethyl-6-(2-methylbenzoyl)-9H-carbazol-3-yl]-, 1-(O-acetyloxime), ethanone, 1-[9-ethyl-6-(2-methyl-4-tetrahydrofuranylmethoxybenzoyl)-9H-carbazol-3-yl]-, 1-(O-acetyloxime), and ethanone, 1-[9-ethyl-6-{2-methyl-4-(2,2-dimethyl-1,3-dioxolanyl)methoxybenzoyl}-9H-carbazol-3-yl]-, 1-(O-acetyloxime). As a commercially available product of an O-acyloxime compound, NCI-831, NCI-930 (produced by ADEKA Corporation), DFI-020, DFI-091 (produced by Daito Chemix Corporation), etc. can be used.

In the present invention, when a photopolymerization initiator is a material other than a biimidazole compound, for example the photopolymerization initiator is an acetophenone compound, etc., the initiator may be used in combination with a sensitizer. Examples of such a sensitizer include 4,4'-bis(dimethylamino)benzophenone, 4,4'-bis(diethylamino)benzophenone, 4-diethylaminoacetophenone, 4-dimethylaminopropiophenone, ethyl 4-dimethylaminobenzoate, 2-ethylhexyl 4-dimethylaminobenzoate, 2,5-bis(4-diethylaminobenzal)cyclohexanone, 7-diethylamino-3-(4-diethylaminobenzoyl)coumarin, and 4-(diethylamino)chalcone.

In the present invention, the content of the photopolymerization initiator is preferably 0.01 to 120 parts by mass, more preferably 1 to 100 parts by mass, and even more preferably 5 to 50 parts by mass relative to 100 parts by mass of the polymerizable compound. By use of such a content of the photopolymerization initiator, curability and coating properties are improved and coloring power and brightness can be more improved.

—Solvent—

Usually, red, green, and blue colored compositions are prepared as liquid compositions by incorporating a solvent. As the solvent, any one being capable of dispersing or dissolving components for constituting a colored composition, unreactable with these components, and moderately volatile can be optionally chosen and used.

Examples of such a solvent include:

(poly)alkylene glycol monoalkyl ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether;

alkyl lactates such as methyl lactate and ethyl lactate;

(cyclo)alkyl alcohols such as methanol, ethanol, propanol, butanol, isopropanol, isobutanol, tert-butanol, octanol, 2-ethylhexanol, and cyclohexanol;

keto alcohol such as diacetone alcohol;

(poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, dipropylene glycol monomethyl ether acetate, 3-methoxybutyl acetate, 3-methyl-3-methoxybutyl acetate;

other ethers such as diethylene glycol dimethyl ether, diethylene glycol methyl ethyl ether, diethylene glycol diethyl ether and tetrahydrofuran;

ketones such as methyl ethyl ketone, cyclohexanone, 2-heptanone, and 3-heptanone;

diacetates such as propylene glycol diacetate, 1,3-butylene glycol diacetate, and 1,6-hexanediol diacetate;

alkoxycarboxylic acid esters such as methyl 3-methoxypropionate, ethyl 3-methoxypropionate, methyl 3-ethoxypropionate, ethyl 3-ethoxypropionate, ethyl ethoxyacetate, and 3-methyl-3-methoxybutyl propionate;

other esters such as ethyl acetate, n-propyl acetate, isopropyl acetate, n-butyl acetate, isobutyl acetate, n-amyl formate, isoamyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxobutanoate;

aromatic hydrocarbons such as toluene and xylene; and amides or lactams such as N,N-dimethylformamide, N,N-dimethylacetamide, and N-methylpyrrolidone.

Of these solvents, (poly)alkylene glycol monoalkyl ethers, alkyl lactates, (poly)alkylene glycol monoalkyl ether acetates, other ethers, ketones, diacetates, alkoxycarboxylic acid esters, and other esters are preferable from the perspectives of solvency, pigment dispersibility, spreadability, etc., and especially, propylene glycol monomethyl ether, propylene glycol monoethyl ether, ethylene glycol monomethyl ether acetate, propylene glycol monomethyl ether acetate, propylene glycol monoethyl ether acetate, 3-methoxybutyl acetate, diethylene glycol dimethyl ether, diethylene glycol methyl ethyl ether, cyclohexanone, 2-heptanone, 3-heptanone, 1,3-butylene glycol diacetate, 1,6-hexanediol diacetate, ethyl lactate, 3-methoxyethyl propionate, 3-ethoxymethyl propionate, 3-ethoxyethyl propionate, 3-methyl-3-methoxybutyl propionate, n-butyl acetate, isobutyl acetate, n-amyl formate, isoamyl acetate, n-butyl propionate, ethyl butyrate, isopropyl butyrate, n-butyl butyrate, ethyl pyruvate, etc. are preferable.

In the present invention, solvents may be used singly or as a mixture of two or more.

Although the content of a solvent is not particularly limited, an amount is preferred that affords a total concentration of the components of the colored composition except the solvent of 5 to 50% by mass, and more preferable is an amount that affords a total concentration of 10 to 40% by mass. By use of such content, it is possible to obtain a colorant dispersion liquid with good dispersibility and stability and a colored composition with good spreadability and stability.

—Additive—

The red, green, and blue colored compositions may contain various additives as necessary.

Examples of such additives include fillers such as glass and alumina; polymeric compounds such as polyvinyl alcohol and poly(fluoroalkyl acrylate); surfactants such as fluorine-based surfactants and silicon-based surfactants; adhesive promoters such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloyloxypropyltrimethoxysilane, and 3-mercaptopropyltrimethoxysilane; antioxidants such as 2,2-thiobis(4-methyl-6-tert-butylphenol), 2,6-di-tert-butylphenol, pentaerythritol tetrakis[3-(3,5-di-tert-butyl-4-hydroxyphenyl)propionate], 3,9-bis[2-[3-(3-tert-butyl-4-hydroxy-5-methylphenyl)-propionyloxy]-1,1-dimethylethyl]-2,4,8,10-tetraoxaspiro[5.5]undecane, and thiodiethylenebis[3-(3,5-di-tert-butyl-4-hydroxyphenyl)propionate]; UV absorbers such as 2-(3-tert-butyl-5-methyl-2-hydroxyphenyl)-5-chlorobenzotriazole and alkoxybenzophenones; flocculation inhibitors such as poly(sodium acrylate); residue improvers such as malonic acid, adipic acid, itaconic acid, citraconic acid, fumaric acid, mesaconic acid, 2-aminoethanol, 3-amino-1-propanol, 5-amino-1-pentanol, 3-amino-1,2-propanediol, 2-amino-1,3-propanediol, and 4-amino-1,2-butanediol; and developability improvers such as mono[2-(meth)acryloyloxyethyl]succinate, mono[2-(meth)acryloyloxyethyl] phthalate, and co-carboxypolycaprolactone mono(meth)acrylate.

A colored composition can be prepared by an appropriate method and it can be prepared, for example, by mixing a colorant, a binder resin, and a polymerizable compound with a solvent and other component to be optionally added. Especially preferable is a method in which a colorant is mixed and dispersed under pulverization in a solvent in the presence of a dispersing agent together with part of a binder resin according to circumstances with, for example, a bead mill, a roll mill, or the like, thereby forming a colorant dispersion liquid by mixing and dispersing while pulverizing, and then a polymerizable compound and, as necessary, a binder resin, a photopolymerization initiator, and further an additional solvent and other components are added to the colorant dispersion liquid and mixed, so that a colored composition is prepared.

Although the color filter of the present invention usually has a red pixel, a green pixel, and a blue pixel, it may further have a yellow pixel or a transparent pixel.

The color filter of the present invention has at least one of the red pixel of the present invention and the green pixel of the present invention and it thereby can display a vivid hue even though it is thin. Moreover, it becomes possible to produce a display device according to the NTSC standard or the DCI-P3 standard.

Method for Producing Color Filter

A method for forming the color filter of the present invention will be described below.

As a method of forming pixels of individual colors constituting the color filter, the following method is provided. First, on a surface of a substrate, a shielding layer (black matrix) is formed as necessary so that a portion where a pixel is to be formed may be divided. Subsequently, on this substrate, a liquid composition of a red radiation-sensitive colored composition of the present invention is applied and then the solvent is evaporated by performing prebaking, so that a coating film is formed. Subsequently, this coating film is exposed to light through a photomask and then developed using an alkali developing solution, thereby dissolving and removing unexposed portions of the coating film. Then, by performing post baking, a pixel array is formed in which a red pixel pattern (colored cured film) is arranged in a prescribed alignment.

Subsequently, using green or blue radiation-sensitive colored compositions and applying, prebaking, exposing, developing, and post baking the individual radiation-sensitive colored compositions in the same manner as described above, a green pixel array and a blue pixel array are formed in order on the same substrate. A color filter is thereby obtained in which a pixel array in the three primary colors red, green and blue is arranged on the substrate. It is noted that the order of forming the pixels of individual colors is not restricted to that described above.

Although the black matrix may be formed by shaping a thin metal film of chromium or the like formed by sputtering or vapor deposition into a desired pattern by using a photolithographic method, it may also be formed in the same manner as in the case of the above-described pixel formation using a radiation-sensitive colored composition in which a black pigment has been dispersed.

Examples of a substrate to be used when forming a colored cured film include glass, silicon, polycarbonate, polyester, aromatic polyamide, polyamideimide, and polyimide.

Such a substrate may, as desired, have been subjected to a proper pretreatment such as chemical treatment with a silane coupling agent or the like, plasma treatment, ion plating, sputtering, vapor phase reaction, and vacuum deposition.

When a radiation-sensitive colored composition is applied to a substrate, an appropriate coating method may be used such as a spray method, a roll coating method, a spin coating method, a slit die coating method (a slit coating method), and a bar coating method. It is especially preferred, to adopt a spin coating method or a slit die coating method.

Prebake is usually performed by combining reduced pressure drying and heat drying. Usually, the reduced pressure drying is performed until the pressure reaches 50 to 200 Pa. Further, the conditions of the heat drying are at 70 to 110° C. for about 1 to about 10° C.

The application thickness, expressed by film thickness after drying, is usually 0.6 to 8 μm, preferably 1.2 to 5 μm.

Examples of the light source of radiation to be used when forming each color pixel include lamp light sources such as a xenon lamp, a halogen lamp, a tungsten lamp, a high-pressure mercury lamp, an ultrahigh-pressure mercury lamp, a metal halide lamp, a medium-pressure mercury lamp, and a low-pressure mercury lamp, and laser light sources such as argon ion laser, YAG laser, XeCl excimer laser, and nitrogen laser. An ultraviolet LED can also be used as an exposure light source. Radiation having a wavelength within the range of 190 to 450 nm is preferred.

Generally, the exposure dose of radiation is preferably 10 to 10,000 J/m$^2$.

Moreover, the above-mentioned alkali developing solution is preferably an aqueous solution of, for example, sodium carbonate, sodium hydrogencarbonate, sodium hydroxide, potassium hydroxide, tetramethylammonium hydroxide, choline, 1,8-diazabicyclo-[5.4.0]-7-undecene, or 1,5-diazabicyclo-[4.3.0]-5-nonene.

In the alkali developing solution, a proper amount of a water-soluble organic solvent, such as methanol and ethanol, a surfactant, etc. may also be added. After alkali development, washing in water is usually performed.

As a development method, a shower development method, a spray development method, a dip development method, a puddle development method, etc. can be used. Preferably, the development conditions are at normal temperature for 5 to 300 seconds.

Temperature conditions of the post baking are usually between approximately 180 to 280° C. and for between approximately 10 to 60 minutes.

The film thickness of the thus-formed pixel is usually 0.5 to 5 μm, preferably 1.0 to 3 μm.

As a second method for forming each color pixel constituting a color filter, the methods of obtaining a pixel of each color by an ink jet system as disclosed in JP 7-318723 A, JP 2000-310706 A, etc. may be used. In this method, a partition also having a shielding function is first formed on the surface of a substrate. Subsequently, a liquid composition of a red thermosetting colored composition of the present invention, as one example, is discharged by an ink jet device to the inside of the partition formed, and then the solvent is evaporated by performing prebaking. Subsequently, after exposure to light as appropriate, the coating film is post-baked to cure, so that a red pixel pattern is formed.

Subsequently, using a green or blue thermosetting colored composition, a green pixel pattern and a blue pixel pattern are sequentially formed one after another on the same substrate in the same manner as described above. A color filter is thereby obtained in which pixel patterns in the three primary colors red, green and blue are arranged on the substrate. It is noted that the order of forming the pixels of the individual colors is not limited to that described above.

Since the partition performs not only a shielding function but also a function for preventing thermosetting colored compositions of individual colors discharged into regions from being chromatically mixed, the film thickness thereof is larger in comparison with the black matrix used for the above-described first method. Therefore, the partition is usually formed using a black radiation-sensitive composition.

The substrate and the light source of radiation to be used for forming a colored cured film and the methods and the conditions of the prebaking and the post baking are the same as those for the above-described first method. The thickness of the pixel formed in such a manner by an ink jet system is similar to the height of the partition.

On the thus-obtained pixel pattern, a protective film is formed as necessary and then a transparent conductive film is formed by sputtering. After forming the transparent conductive film, a color filter may be formed by further forming a spacer. Although the spacer is usually formed using a radiation-sensitive composition, it may also be a spacer having a shielding property (black spacer). In this case, a colored radiation-sensitive composition is used in which a black colorant has been dispersed.

Since the color filter of the present invention formed in this manner is a thin film and can display a vivid hue, it is very useful for a display device.

Display Device

The display device of the present invention is one including a color filter of the present invention and a light emitting element containing quantum dots.

The display device of the present invention makes it possible to display authentic clean hues by converting light supplied from a light source contained in the light emitting element by use of quantum dots and making the resulting light to pass the color filter of the present invention.

FIG. 1 is a cross sectional diagram schematically showing the first example of the display device of the present invention.

The display device 1 shown in FIG. 1, which is a first example of the display device of the present invention, has a light emitting element 2 and a liquid crystal display panel 3 and constitutes an edge-lit liquid crystal display device.

As shown in FIG. 1, the light emitting element 2 of the display device 1 has an LED assembly 5, a guide body 15, a reflective sheet 12, and an optical sheet 17, which constitute an edge lit, and an LED 5a, which serves as a light source, is mounted on the inner wall of the LED assembly 5. Although not depicted, in the LED assembly 5, a plurality of LEDs 5a is aligned at prescribed intervals along the longitudinal direction of a light entry surface of the guide body 15.

The light source of the light emitting element 2 is not limited to the above-mentioned LED 5a, and light emitting apparatuses as lamps capable of emitting light containing ultraviolet light, blue light or the like and organic EL elements can also be used.

Quantum dot members 4 have been formed at intervals in the direction in which the LED 5a emits light.

The quantum dot member 4 as used herein refers to an aggregate of quantum dots that convert the energy of light with a specific wavelength emitted from the LED 5a into the energy of light with another specific wavelength. The quantum dot member 4 may be formed with the inclusion of a plurality of quantum dots and may be formed with the inclusion of resin.

The quantum dot refers to a semiconductor particle of a prescribed size having a quantum confinement effect. Generally, the diameter of a quantum dot is within the range of 1 to 10 nm.

If such a quantum dot absorbs light emitted from an excitation source, such as the above-mentioned LED 5a, and thereby is brought into an excited state, it releases energy corresponding to the energy band gap of the quantum dot, so that it is deactivated. Accordingly, if the size or the substance composition of a quantum dot is adjusted, the energy band gap can be adjusted, so that energies of various levels of wavelength range can be obtained as light emission.

For example, when the size of a quantum dot is 5.5 to 6.5 nm, reddish light is emitted; when the size of a quantum dot is 4.0 to 5.0 nm, greenish light is emitted; and when the size of a quantum dot is 2.0 to 3.5 nm, bluish light is emitted. Yellowish light can be obtained with a quantum dot having an intermediate size between a quantum dot that emits a red color and a quantum dot that emits a green color.

Therefore, light in various colors containing red, green, and blue can easily be obtained from a quantum dot by a quantum size effect. Therefore, it is possible to produce colors in which light is emitted at individual wavelengths and also possible to produce light of, for example, red, green, blue, or the like from a plurality of types of quantum dots and produce and realize a white color or various colors by mixing those colors of light. Therefore, the quantum dot member 4, which is an aggregate of quantum dots, may be formed with the inclusion of a plurality of types of quantum dots different in size or composition.

Such a quantum dot can be synthesized by a chemical wet method. The chemical wet method is a method of putting a precursor substance of a quantum dot into an organic solvent to grow particles. Examples of the quantum dot include II-VI Group compounds such as CdSe, CdTe, CdS, ZnSe, ZnTe, ZnS, HgTe, or HgS.

Moreover, the quantum dot may be made to have a core-shell structure. Preferably, the core of the core-shell structure contains any one substance selected from the group consisting of CdSe, CdTe, CdS, ZnSe, ZnTe, ZnS, HgTe, and HgS, and the shell also contains one substance selected from the group consisting of CdSe, CdTe, CdS, ZnSe, ZnTe, ZnS, HgTe, and HgS. Moreover, III-V Group compounds, such as InP, are also available.

Moreover, it is also possible to constitute the quantum dots of the quantum dot member 4 with the exclusion of elements that are known to be harmful to humans, such as Pb (lead) and Cd (cadmium). In that case, there can specifically be used quantum dots made of a compound containing at least two or more elements selected from the group consisting of Be (beryllium), Mg (magnesium), Ca (calcium), Sr (strontium), Ba (barium), Cu (copper), Ag (silver), Gold (Au), zinc (Zn), B (boron), Al (aluminum), Ga (gallium), In (indium), Tl (thallium), C (carbon), Si (silicon), Ge (germanium), Sn (tin), N (nitrogen), P (phosphorus), As (arsenic), Sb (antimony), Bi (bismuth), O (oxygen), S (sulfur), Se (selenium), Te (tellurium), and Po (polonium) and quantum dots made of an Si compound.

In addition, as the quantum dots with the exclusion of elements such as Pb and Cd, quantum dots made of a compound containing In as a constituent and quantum dots made of an Si compound are preferable. More specifically, quantum dots made of at least one selected from the group consisting of an InP/ZnS compound, a CuInS2/ZnS compound, AgInS2 compound, a (ZnS/AgInS2) solid solution/ZnS compound, a Zn-doped AgInS2 compound, and Si are more preferable.

The quantum dot member 4 may contain a resin together with the quantum dots as described above. This resin may be an adhesive substance having optical transparency. Herein, it is preferred to mainly use, as the resin contained in the quantum dot member 4, a substance that does not absorb light emitted from a light source such as the LED 5a. Specifically, as the above-mentioned resin an epoxy resin, a polysiloxane resin, an acrylic resin, a polyimide resin, a polycarbonate resin, or mixtures thereof, etc. can be used. Inclusion of such a resin in the quantum dot member 4 makes it possible to improve the stability of the formation of the quantum dot member 4 and also makes it possible to improve the durability of the display device 1 against an external impact.

As described above, quantum dots are used for constituting the quantum dot member 4 in the light emitting element 2 of the display device 1 of the present invention. The light emitting element 2 of the display device 1 of the present invention can convert a monochromatic light emitted from a light source into, for example, a blue light, a red light, a green light, or the like by use of the quantum dots of the quantum dot member 4.

The light emitting element 2 of the display device 1 of the present invention can also form, for example, a light formed by mixing a blue light, a red light, and a green light together by use of the quantum dot member 4. Such a quantum dot member 4 can be formed in the form of a collection of quantum dots that convert a monochromatic light into a blue light, quantum dots that convert a monochromatic light into a red light, and quantum dots that convert a monochromatic light into a green light, for example, by use of these quantum dots in combination. Such a quantum dot member 4 can convert an incident monochromatic light into a blue light, a red light, and a green light and can emit them after mixing.

Therefore, when the quantum dot member 4 in the light emitting element 2 of the display device 1 of the present invention is one constituted using a plurality of types of quantum dots, the monochromatic light that was emitted from the emission source LED 5*a* and entered into the quantum dot member 4 of the light emitting element 2 is converted into blue light, red light, green light, or the like, and then is emitted as light in which those light components have been mixed.

More specifically, when the light emitted from the LED 5*a* is ultraviolet light, a quantum dot that converts the ultraviolet light into blue light, a quantum dot that converts the ultraviolet light into red light, and a quantum dot that converts the ultraviolet light into green light may be used for the configuration of the quantum dot member 4. In this case, the ultraviolet light that entered into the quantum dot member 4 is converted into blue light, red light, or green light, which are then emitted from the quantum dot member 4 as light in which those light components have been mixed.

When the light emitted from the LED 5*a* is blue light, a quantum dot that converts the blue light into red light and a quantum dot that converts the blue light into green light may be used for the configuration of the quantum dot member 4. In this case, the blue light that entered into the quantum dot member 4 is partly used as blue light as it is and another part thereof is converted into red light or green light, which are then emitted from the quantum dot member 4 as light in which those light components have been mixed.

When the light emitted from the LED 5*a* is blue light, a quantum dot that converts the blue light into red light, a quantum dot that converts the blue light into green light, and a quantum dot that converts the blue light into blue light different in wavelength property from the blue light emitted from the LED 5*a* may be used for the configuration of the quantum dot member 4. In this case, the blue light that entered into the quantum dot member 4 is converted into blue light, red light, or green light, which are then emitted from the quantum dot member 4 as light in which those light components have been mixed.

At this time, the emission spectrum of the light emitting element 2 of the display device 1 of the present invention are preferably one having a first peak wavelength at 430 to 480 nm, a second peak wavelength at 510 to 560 nm, and a third peak wavelength at 600 to 660 nm.

The first peak wavelength is more preferably 435 to 470 nm, even more preferably 440 to 460 nm, and particularly preferably 445 to 455 nm. The second peak wavelength is more preferably 515 to 555 nm, even more preferably 520 to 550 nm, and particularly preferably 525 to 550 nm. The third peak wavelength is more preferably 610 to 650 nm, even more preferably 615 to 645 nm, and particularly preferably 620 to 640 nm. In adoption of such a peak wavelength as mentioned above, in the display device 1 of the present invention, the color filter 9 of the present invention, which is a constituent of the display device, can display a more vivid hue.

The first peak wavelength preferably has a half-value width of 70 nm or less, more preferably 60 nm or less, even more preferably 50 nm or less, and particularly preferably 40 nm or less. The second peak wavelength preferably has a half-value width of 80 nm or less, more preferably 70 nm or less, even more preferably 60 nm or less, and particularly preferably 50 nm or less. The third peak wavelength preferably has a half-value width of 80 nm or less, more preferably 70 nm or less, even more preferably 60 nm or less, and particularly preferably 50 nm or less. In adoption of such a peak wavelength as mentioned above, in the display device 1 of the present invention, the color filter 9 of the present invention, which is a constituent of the display device, can display a more vivid hue.

Moreover, it is preferred that emission intensity takes the maximum value at the first peak wavelength among the first peak wavelength, the second peak wavelength, and the third peak wavelength.

In the light emitting element 2, the above-mentioned light emitted from the quantum dot member 4 advances toward a light entry surface of the guide body 15.

Light that entered into the guide body 15 from the quantum dot member 4 enters into a liquid crystal display panel 3 through an upper optical sheet 17 together with light reflected on a reflective sheet 12. As the optical sheet 17, a diffusion sheet, a prism sheet, etc. can be used, for example.

The liquid crystal display panel 3 contains a liquid crystal layer 10. Although the liquid crystal display panel 3 has components including a substrate for supporting the liquid crystal layer 10, an electrode and a driving circuit for driving the liquid crystal layer, and an orientation film for orientating the liquid crystal layer, these are omitted in FIG. 1. In this liquid crystal display panel 3, the liquid crystal layer 10 is a pixelated image display layer and individual regions of the liquid crystal layer 10, i.e., pixels, can be driven independently of other regions (pixels).

The display device 1 of the present invention is a color liquid display device capable of performing color display, and the liquid crystal display panel 3 is provided with the color filter 9 of the present invention as described above. When the display device 1 is a full-color red, green, blue (RGB) display device, the liquid crystal display panel 3 can contain one set of red pixels 9R, one set of blue pixels 9B, and one set green pixels 9G as shown in FIG. 1. The pixels of the color filter 9 are arranged at the positions of the individual pixels or subpixels of the liquid crystal layer 10.

The light that was emitted from the light emitting element 2 and entered into the liquid crystal display panel 3 then passes a substrate, etc., not shown, and advances toward the liquid crystal layer 10. At this time, the light that advances toward the liquid crystal layer 10 is light having been produced by mixing blue light, red light, and green light each generated by the quantum dot member 4 as described above. Therefore, the spectrum of the light can contain a first through a third emission peaks within the above-mentioned preferable wavelength ranges with the above-mentioned preferable half-value widths.

The light that advances toward the liquid crystal layer 10 passes the liquid crystal layer 10, then advances toward the color filter 9, and then is filtered by individual pixels, namely, the red pixel 9R, the blue pixel 9B, and the green pixel 9G, becoming blue light, green light, or red light, and then are emitted to the upper side.

At this time, the three light components, namely, blue light, green light, and red light, are controlled in quantity of light (transmittance) by the voltage applied to the individual pixels of the liquid crystal layer 10, and thereby the display device 1 of the present invention can display a multicolored image. The display device 1 of the present invention can display an image in a more vivid hue by the effect of the color filter 9 of the present invention.

While the quantum dot member 4, as well as the above-described color filter 9 of the present invention, is a main component in the display device 1 of the present invention having the above-described configuration, an example of a quantum dot member 4 separated from an emission source LED 5*a* is shown in FIG. 1. However, in the display device 1 of the present invention, the arrangement of the quantum dot member 4 is not necessarily restricted to that shown in FIG. 1. For example, the quantum dot member 4 may also be arranged directly on an emission source such as the LED 5a or while directly covering the emission source.

Moreover, in the display device of the present invention, it is also possible to provide a quantum dot member of a light emitting element in regions other than the internal part of an LED assembly. For example, in the display device 1 of FIG. 1, it is also possible to provide the quantum dot member between the liquid crystal layer 10 and a surface of the guide body 15 of the light emitting element 2, that is, the surface facing the liquid crystal layer 10; between the reflective sheet 12 and a surface of the guide body 15, that is, the surface facing the reflective sheets 12; or in the internal part of the guide body 15.

Figure 2:
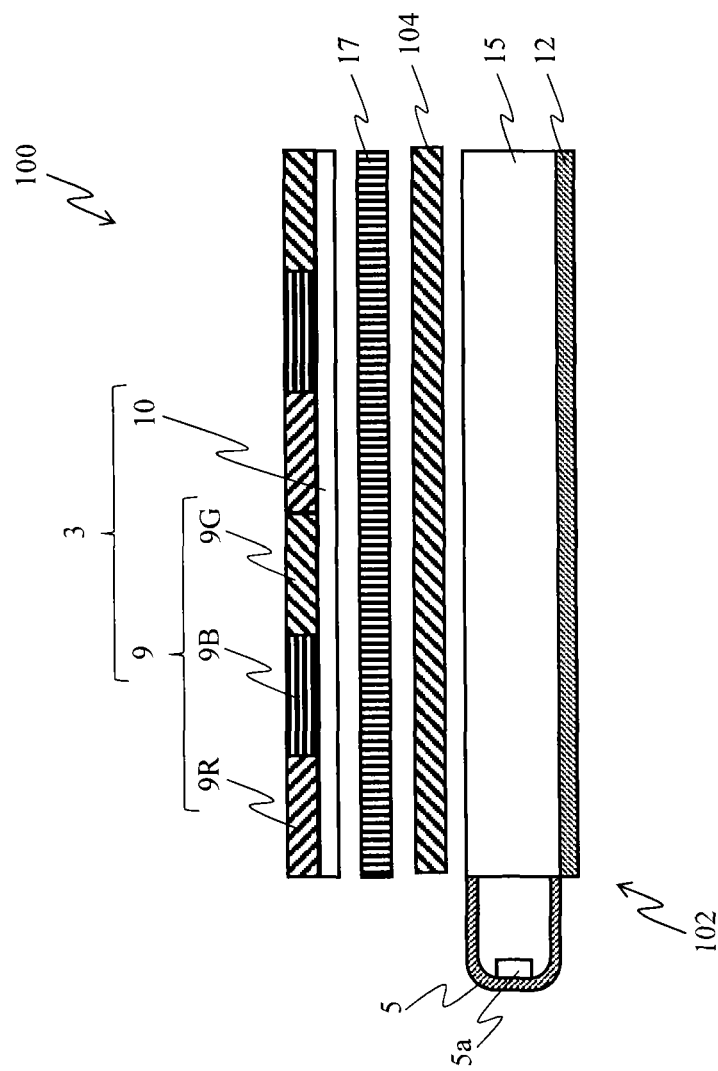
FIG. 2 is a cross sectional diagram schematically showing the second example of the display device of the present invention.

FIG. 2 is a cross sectional diagram schematically showing the second example of the display device of the present invention.

In the display device 100 shown in FIG. 2, which is the second example of the display device of the present invention, a quantum dot member 104 is formed in a sheet shape and is provided not inside an LED assembly 5 but between a liquid crystal layer 10 and a surface of a guide body 15, the surface facing the liquid crystal layer 10. Moreover, the display device 100 has the same structure as the display device 1 of FIG. 1 except that the shape and the arrangement of the quantum dot member 104 are different. Therefore, in the display device 100 shown in FIG. 2, the same reference numerals are used for components common with those in the display device 1 of FIG. 1 and overlapping descriptions will be omitted appropriately.

The display device 100 of the present invention has a light emitting element 102 and a liquid crystal display panel 3 containing a color filter 9 of the present invention and a liquid crystal layer 10, and it constitutes a liquid crystal display device in the same manner as the display device 1 of FIG. 1.

As shown in FIG. 2, the light emitting element 102 of the display device 100 has an LED assembly 5 containing an LED 5a to serve as an emission source, a guide body 15, a reflective sheet 12, and an optical sheet 17, and a quantum dot member 104 formed in a sheet shape is disposed between the optical sheet 17 and a surface of the guide body 15, the surface facing the liquid crystal layer 10.

The quantum dot member 104 of the light emitting element 102 may be constituted using the same quantum dot as that of the quantum dot member 4 of the light emitting element 2 and has the same configuration as the quantum dot member 4 except that the shape thereof is a sheet shape.

The light emitting element 102 with the above-described structure allows the light emitted from the emission source LED 5a to advance toward a light entry surface of the guide body 15. The light emitted from the LED 5a is monochromatic light, such as ultraviolet light and blue light.

The light that entered into the guide body 15 from the LED 5a enters into the quantum dot member 104 together with the light reflected on the reflective sheet 12. The light that entered into the quantum dot member 104 is converted into blue light, red light, or green light, which are mixed and then emitted as white light. Then, the light enters into the liquid crystal display panel 3 through the optical sheet 17 located in the upper part of the quantum dot member 104.

The light that entered into the liquid crystal display panel 3 advances toward the liquid crystal layer 10 and, after passing the liquid crystal layer 10, advances toward the color filter 9 of the present invention. Then, the light is filtered at the color filter 9 by individual pixels, namely, a red pixel 9R, a blue pixel 9B, and a green pixel 9G, to become blue light, green light, or red light, which are then emitted to the upper part side.

At this time, the three light components, namely, blue light, green light, and red light, are controlled in quantity of light (transmittance) by the voltage applied to the individual pixels of the liquid crystal layer 10, and thereby the display device 100 of the present invention can display a multicolored image. Moreover, the display device 100 of the present invention can display an image in a more vivid hue by the effect of the color filter 9 of the present invention.

In the display device of the present invention, it is also possible, as still another example, to form a quantum dot member in the form of a layer and arrange this between a liquid crystal layer and a color filter of a liquid crystal display panel. Specifically, it is possible to constitute a light emitting element by combining an LED assembly 5, a guide body 15, a reflective sheet 12, an optical sheet 17, and a liquid crystal layer 10 of a liquid crystal display panel 3, which are the same as those of the display device 1 of FIG. 1, with a layer-shaped quantum dot member, and also constitute a display device capable of undergoing color display by further combining that display device with the color filter 9 of the liquid crystal display panel 3.

Figure 3:
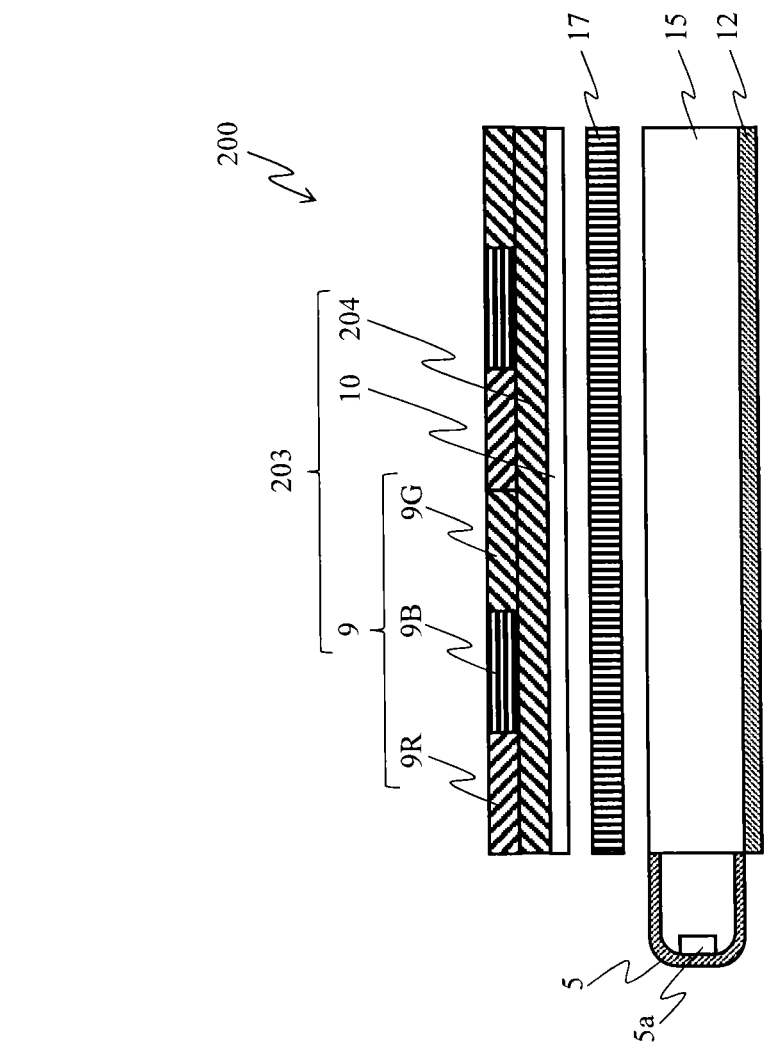
FIG. 3 is a cross sectional diagram schematically showing the third example of the display device of the present invention.

FIG. 3 is a cross sectional diagram schematically showing the third example of the display device of the present invention.

In the display device 200 shown in FIG. 3, which is the third example of the display device of the present invention, a quantum dot member 204 is formed in a layer shape and is provided not inside an LED assembly 5 but between a liquid crystal layer 10 and a color filter 9 of a liquid crystal display panel 203. More specifically, in the display device 200, the layer-shaped quantum dot member 204 is formed on the color filter 9 of the liquid crystal display panel 203. Moreover, the display device 200 has the same structure as the display device 1 of FIG. 1 except that the shape and the arrangement of the quantum dot member 204 are different. Therefore, in the display device 200 shown in FIG. 3, the same reference numerals are used for components common with those in the display device 1 of FIG. 1 and overlapping descriptions will be omitted appropriately.

As shown in FIG. 3, the display device 200 of the present invention has an LED assembly 5 containing an LED 5a to serve as an emission source, a guide body 15, a reflective sheet 12, an optical sheet 17, and the liquid crystal display panel 203 containing the color filter 9, the liquid crystal layer 10 and the quantum dot member 204, and it constitutes a liquid crystal display device in the same manner as the display device 1 of FIG. 1.

The liquid crystal display panel 203 of the display device 200 is constituted with the inclusion of the liquid crystal layer 10 in the same manner as the liquid crystal display panel 3 of FIG. 1. Although the liquid crystal display panel 203 has components including a substrate for supporting the liquid crystal layer 10, an electrode and a driving circuit for driving the liquid crystal layer, and an orientation film for orientating the liquid crystal layer, these are omitted in FIG. 3. In this liquid crystal display panel 203, the liquid crystal layer 10 is a pixelated image display layer and individual regions of the liquid crystal layer 10, i.e., pixels, can be driven independently of other regions (pixels).

In addition, the liquid crystal display panel 203 is provided with the color filter 9 of the present invention and the layer-shaped quantum dot member 204 as described above. The quantum dot member 204 is formed on the color filter 9 and is arranged between the liquid crystal layer 10 and the color filter 9. For example, when the color filter 9 has pixel patterns of individual colors and a protective film as their upper layer, the quantum dot member 204 is preferably disposed on the pixel patterns and between the pixel patterns and the protective film.

The quantum dot member 204 provided in the liquid crystal display panel 203 may be constituted using the same quantum dot as that of the quantum dot member 4 of FIG. 1, and it has the same configuration as that of the quantum dot member 4 except the shape thereof is a layer shape.

In the display device 200 of the present invention having the above-described configuration, a light emitting element is constituted by combining an LED assembly 5 containing an LED 5a to serve as an emission source, a guide body 15, a reflective sheet 12, an optical sheet 17, and the liquid crystal layer 10 and the quantum dot member 204 of the liquid crystal display panel 203. Moreover, a liquid crystal display device capable of undergoing color display can be constituted by combining the color filter 9 of the liquid crystal display panel 203 with the light emitting element.

In the display device 200 of the present invention shown in FIG. 3, the light emitted from the emission source LED 5a advances toward a light entry surface of the guide body 15. The light emitted from the LED 5a is monochromatic light, such as ultraviolet light and blue light.

Then, the light that entered into the guide body 15 from the LED 5a enters together with light reflected on the reflective sheet 12 into the liquid crystal display panel 203 through the optical sheet 17 located in the upper part.

The light that entered into the liquid crystal display panel 203 advances toward the liquid crystal layer 10 and, after passing the liquid crystal layer 10, advances toward the quantum dot member 204 on the color filter 9. The light that entered into the quantum dot member 204 is converted into blue light, red light, or green light, which are mixed and then emitted as white light.

Then, the light emitted from the quantum dot member 204 advances toward the color filter 9 of the present invention. Then, the light is filtered at the color filter 9 by individual pixels, namely, a red pixel 9R, a blue pixel 9B, and a green pixel 9G, to become blue light, green light, or red light, which are then emitted to the upper part side.

At this time, the three light components, namely, blue light, green light, and red light, are controlled in quantity of light (transmittance) by the voltage applied to the individual pixels of the liquid crystal layer 10. Accordingly, the display device 200 of the present invention can display a multicolored image. Moreover, the display device 200 of the present invention can display an image in a more vivid hue by the effects of the quantum dot member 204 and the color filter 9 of the present invention.

EXAMPLES

Hereafter, embodiments of the present invention will be described more concretely with reference to examples. However, the present invention is not limited to the following examples.

Synthesis of Binder Resin

Synthesis Example 1

A flask equipped with a cooling tube and a stirrer was charged with 90 parts by mass of propylene glycol monomethyl ether acetate and then flushed with nitrogen. After heating to 90° C., a mixed solution of 50 parts by mass of propylene glycol monomethyl ether acetate, 12 parts by mass of N-phenylmaleimide, 10 parts by mass of styrene, 38 parts by mass of 2-ethylhexyl EO-modified acrylate (produced by Toagosei Co., Ltd., trade name: M-120), 10 parts by mass of 2-hydroxyethyl methacrylate, 30 parts by mass of methacrylic acid, and 2 parts by mass of mercaptopropionic acid as a chain transfer agent and a mixed solution of 5 parts by mass of 2,2'-azobisbutyronitrile and 60 parts by mass of propylene glycol monomethyl ether acetate were each dropped over 2 hours, and polymerization was performed for 1 hour while this temperature was held. Next, 34.88 parts by mass of 4-hydroxybutyl acrylate glycidyl (produced by Nippon Kasei Chemical Co., Ltd.), 1.68 parts by mass of tetrabutylammonium bromide, and 0.34 parts by mass of 4-methoxyphenol were charged, and an addition reaction was performed at 110° C. for 5 hours. Finally, the solid concentration was adjusted to 40% by mass by adding propylene glycol monomethyl ether acetate. The resulting resin had an Mw of 12,500 and an Mn of 5,300. This is named binder resin solution (B1).

Preparation of Colorant Dispersion Liquid

Preparation Example 1

By using 4.44 parts by mass of C. I. Pigment Red 166 and 7.56 parts by mass of C. I. Pigment Yellow 150 as a colorant, 13.0 parts by mass (solid concentration=40% by mass) of BYK-LPN21116 (produced by BYK Chemie GmbH) as a dispersing agent, 10.0 parts by mass (solid concentration: 40% by mass) of binder resin solution (B1) as a binder resin, and 57.0 parts by mass of propylene glycol monomethyl ether acetate and 8.0 parts by mass of propylene glycol monoethyl ether as a solvent, and mixing and dispersing them with a bead mill for 12 hours, a red colorant dispersion liquid (R-1) was prepared.

Preparation Examples 2 to 8

Red colorant dispersion liquids (R-2) to (R-8) were prepared in the same manner as Preparation Example 1 except that the kind and the amount of each component were changed in Preparation Example 1 as shown in Table 1.

Preparation Examples 9 to 12

Green colorant dispersion liquids (G-1) to (G-4) were prepared in the same manner as Preparation Example 1 except that the kind and the amount of each component were changed in Preparation Example 1 as shown in Table 2.

Preparation Example 13

Blue colorant dispersion liquid (B-1) was prepared in the same manner as Preparation Example 1 except that the kind and the amount of each component were changed in Preparation Example 1 as shown in Table 3.

TABLE 1

| | | Preparation Example 1 R-1 | Preparation Example 2 R-2 | Preparation Example 3 R-3 | Preparation Example 4 R-4 | Preparation Example 5 R-5 | Preparation Example 6 R-6 | Preparation Example 7 R-7 | Preparation Example 8 R-8 |
|---|---|---|---|---|---|---|---|---|---|
| Colorant | R166 | 4.44 | — | — | — | — | — | — | — |
| | R242 | — | 5.76 | — | — | — | — | — | — |
| | Cyanine Compound 1 | — | — | 2.04 | — | — | — | — | — |
| | R254 | — | — | — | 2.88 | — | — | — | — |
| | R48:3 | — | — | — | — | — | 1.92 | — | — |
| | R176 | — | — | — | — | — | — | — | 1.44 |
| | R177 | — | — | — | — | — | — | 1.32 | — |
| | Xanthene Compound 1 | — | — | — | — | 0.36 | — | — | — |
| | Y150 | 7.56 | 6.24 | 9.96 | 9.12 | 11.64 | 10.08 | 10.68 | 10.56 |
| Dispersant | LPN21116 | 13.0 | 13.0 | 13.0 | 13.0 | 13.0 | 13.0 | 13.0 | 13.0 |
| Binder Resin Solution | B1 | 10.0 | 10.0 | 10.0 | 10.0 | 10.0 | 10.0 | 10.0 | 10.0 |
| Solvent | PGMEA | 57.0 | 57.0 | 57.0 | 57.0 | 57.0 | 57.0 | 57.0 | 57.0 |
| | PGEE | 8.0 | 8.0 | 8.0 | 8.0 | 8.0 | 8.0 | 8.0 | 8.0 |

TABLE 2

| | | Preparation Example 9 G-1 | Preparation Example 10 G-2 | Preparation Example 11 G-3 | Preparation Example 12 G-4 |
|---|---|---|---|---|---|
| Colorant | G7 | 6.00 | 4.80 | — | — |
| | G36 | — | — | 6.24 | — |
| | G58 | — | — | — | 7.20 |
| | Y180 | 6.00 | — | 5.76 | 4.80 |
| | Y185 | — | 7.20 | — | — |
| Dispersant | LPN21116 | 13.0 | 13.0 | 13.0 | 13.0 |
| Binder Resin Solution | B1 | 10.0 | 10.0 | 10.0 | 10.0 |
| Solvent | PGMEA | 57.0 | 57.0 | 57.0 | 57.0 |
| | PGEE | 8.0 | 8.0 | 8.0 | 8.0 |

TABLE 3

| | | Preparation Example 13 B-1 |
|---|---|---|
| Colorant | B15:6 | 7.20 |
| | B16 | 4.80 |
| Dispersant | LPN21116 | 13.0 |
| Binder Resin Solution | B1 | 10.0 |
| Solvent | PGMEA | 57.0 |
| | PGEE | 8.0 |

In Tables 1 to 3, each component is as follows.

R166: C. I. Pigment Red 166
R242: C. I. Pigment Red 242
Cyanine compounds 1: The compounds represented by the following formula (2)
R254: C. I. Pigment Red 254
R48:3: C. I. Pigment Red 48:3
R176: C. I. Pigment Red 176
R177: C. I. Pigment Red 177
Xanthene compounds: The compounds represented by the following formula (3)
Y150: C. I. Pigment Yellow 150
Y180: C. I. Pigment Yellow 180
Y18: C. I. Pigment Yellow 185
G7: C. I. Pigment Green 7
G36: C. I. Pigment Green 36
G58: C. I. Pigment Green 58
B15:6: C. I. Pigment Blue 15:6
B16: C. I. Pigment Blue 16
LPN21116: BYK-LPN21116
(produced by BYK Chemie GmbH, nonvolatile components: 40% by mass, amine value: 29 mgKOH/g; amine value per gram of solid: 72.5 mgKOH)
LPN6919: BYK-LPN6919
(produced by BYK Chemie GmbH, nonvolatile components: 60% by mass, amine value: 72 mgKOH/g; amine value per gram of solid: 120.0 mgKOH)
PGMEA: propylene glycol monomethyl ether acetate
PGEE: propylene glycol monoethyl ether

[Chemical Formula 2]

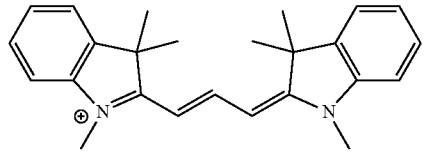
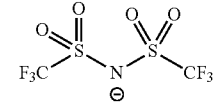

(2)

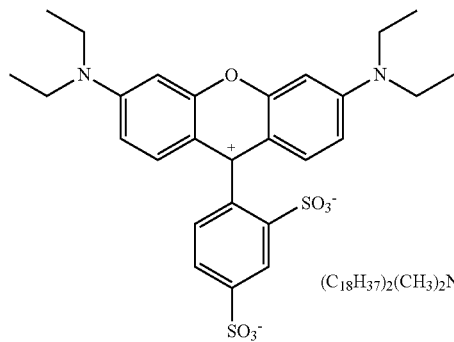

(3)

Preparation of Colorant Composition

Preparation Example 101

By mixing 500 parts by mass of colorant dispersion liquid (R-1) as a colorant, 20.7 parts by mass (solid concentration: 40% by mass) of binder resin solution (B1) as a binder resin, 28.3 parts by weight of a mixture of dipentaerythritol hexaacrylate and dipentaerythritol pentaacrylate as a polymerizable compound (produced by Nippon Kayaku Co., Ltd., trade name: KAYARAD DPHA), 5.7 parts by mass of 2-benzyl-2-dimethylamino-1-(4-morpholinophenyl)butan-1-one (produced by Ciba Specialty Chemicals, trade name: Irgacure 369) as a photopolymerization initiator, 5.9 parts by mass of a 5% by mass solution in propylene glycol monomethyl ether acetate of MEGAFAC F-554 (produced by DIC, Inc.) as a fluorine-based surfactant, 7.5 parts by mass of a 20% by mass solution in propylene glycol monomethyl ether acetate of a compound represented by the following formula (4) as an additive, and 177 parts by mass of propylene glycol monomethyl ether acetate and 255 parts by mass of 3-methoxybutyl acetate as a solvent, a red colored composition (RS-1) was prepared. The content of the colorant in the colored composition (RS-1) is 40% by mass in the overall solid content.

[Chemical Formula 3]

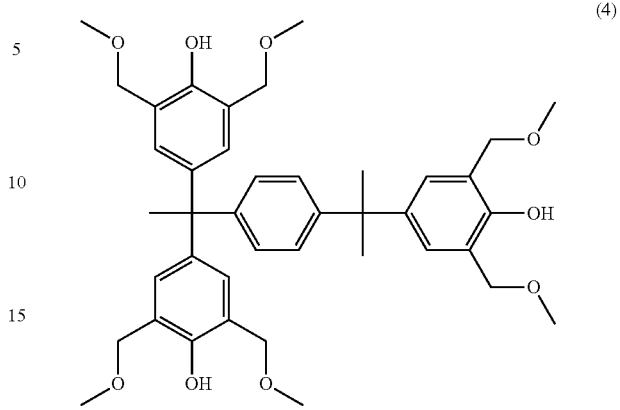

(4)

Preparation Examples 102 to 108

Red colored compositions (RS-2) to (RS-8) were prepared by changing the kind and the amount of each component in Preparation Example 101 as shown in Table 4. The content of the colorant in the colored compositions (RS-2) to (RS-8) were each 40% by mass in the overall solid content.

Preparation Examples 109 to 112

Green colored compositions (GS-1) to (GS-4) were prepared by changing the kind and the amount of each component in Preparation Example 101 as shown in Table 5. The content of the colorant in the colored compositions (GS-1) to (GS-4) were each 40% by mass in the overall solid content.

Preparation Example 113

Blue colored composition (BS-1) was prepared by changing the kind and the amount of each component in Preparation Example 101 as shown in Table 6. The content of the colorant in the colored composition (BS-1) is 20% by mass in the overall solid content.

TABLE 4

| | | Preparation Example 101 RS-1 | Preparation Example 102 RS-2 | Preparation Example 103 RS-3 | Preparation Example 104 RS-4 | Preparation Example 105 RS-5 | Preparation Example 106 RS-6 | Preparation Example 107 RS-7 | Preparation Example 108 RS-8 |
|---|---|---|---|---|---|---|---|---|---|
| Colorant | R-1 | 500 | — | — | — | — | — | — | — |
| Dispersion | R-2 | — | 500 | — | — | — | — | — | — |
| Liquid | R-3 | — | — | 500 | — | — | — | — | — |
| | R-4 | — | — | — | 500 | — | — | — | — |
| | R-5 | — | — | — | — | 500 | — | — | — |
| | R-6 | — | — | — | — | — | 500 | — | — |
| | R-7 | — | — | — | — | — | — | 500 | — |
| | R-8 | — | — | — | — | — | — | — | 500 |
| Binder Resin Solution | B1 | 20.7 | 20.7 | 20.7 | 20.7 | 20.7 | 20.7 | 20.7 | 20.7 |
| Polymerizable Compound | | 28.3 | 28.3 | 28.3 | 28.3 | 28.3 | 28.3 | 28.3 | 28.3 |
| Photopolymerization Initiator | | 5.7 | 5.7 | 5.7 | 5.7 | 5.7 | 5.7 | 5.7 | 5.7 |
| Antioxidant | | — | — | — | — | — | — | — | — |
| Thermosetting Agent | | 7.5 | 7.5 | 7.5 | 7.5 | 7.5 | 7.5 | 7.5 | 7.5 |
| Surfactant | | 5.9 | 5.9 | 5.9 | 5.9 | 5.9 | 5.9 | 5.9 | 5.9 |
| Solvent | PGMEA | 177 | 177 | 7.0 | 177 | 7.0 | 177 | 177 | 177 |
| | MBA | 255 | 255 | — | 255 | — | 255 | 255 | 255 |
| | PGME | — | — | 255 | — | 255 | — | — | — |
| | DPMA | — | — | 170 | — | 170 | — | — | — |

TABLE 5

|  |  | Preparation Example 109 GS-1 | Preparation Example 110 GS-2 | Preparation Example 111 GS-3 | Preparation Example 112 GS-4 |
|---|---|---|---|---|---|
| Colorant Dispersion Liquid | G-1 | 500 | — | — | — |
|  | G-2 | — | 500 | — | — |
|  | G-3 | — | — | 500 | — |
|  | G-4 | — | — | — | 500 |
| Binder Resin Solution | B1 | 20.7 | 20.7 | 20.7 | 20.7 |
| Polymerizable Compound |  | 28.3 | 28.3 | 28.3 | 28.3 |
| Photopolymerization Initiator |  | 5.7 | 5.7 | 5.7 | 5.7 |
| Thermosetting Agent |  | 7.5 | 7.5 | 7.5 | 7.5 |
| Surfactant |  | 5.9 | 5.9 | 5.9 | 5.9 |
| Solvent | PGMEA | 177 | 177 | 177 | 177 |
|  | MBA | 255 | 255 | 255 | 255 |

TABLE 6

|  |  | Preparation Example 113 BS-1 |
|---|---|---|
| Colorant Dispersion Liquid | B-1 | 250 |
| Binder Resin Solution | B1 | 96.8 |
| Polymerizable Compound |  | 48.7 |
| Photopolymerization Initiator |  | 6.5 |
| Thermosetting Agent |  | 13.0 |
| Surfactant |  | 10.1 |
| Solvent | PGMEA | 235 |
|  | MBA | 340 |

In Tables 4 to 6, the components are as follows.
MBA: 3-Methoxybutyl acetate
PGME: Propylene glycol monomethyl ether
DPMA: Dipropylene glycol monomethyl ether acetate

Example 1

<Evaluation of Chromatic Property and Evaluation of Film Thickness at Fixed Chromaticity>

Colored composition (RS-1) was applied to a glass substrate with a slit die coater and then prebaked for 1 minute with a hot plate at 90° C., thereby forming a coating film. The same operation was performed with variation of the application conditions of the slit die coater, so that three coating films different in film thickness were formed.

Subsequently, after cooling these substrates to room temperature, each coating film was irradiated with radiation containing wavelengths of 365 nm, 405 nm, and 436 nm in an exposure dose of 60 mJ/m$^2$ with a high pressure mercury lamp, without a photomask. Then, shower development was performed for 90 seconds by discharging a developing solution composed of a 0.04% by mass aqueous potassium hydroxide solution at 23° C. under a developing pressure of 1 kgf/cm2 (nozzle diameter: 1 mm) to these substrates. Subsequently, the substrates were rinsed with ultrapure water, air dried, and then subjected to post-baking for 20 minutes within a clean oven at 230° C., so that three red cured films for evaluation were formed.

Figure 4:
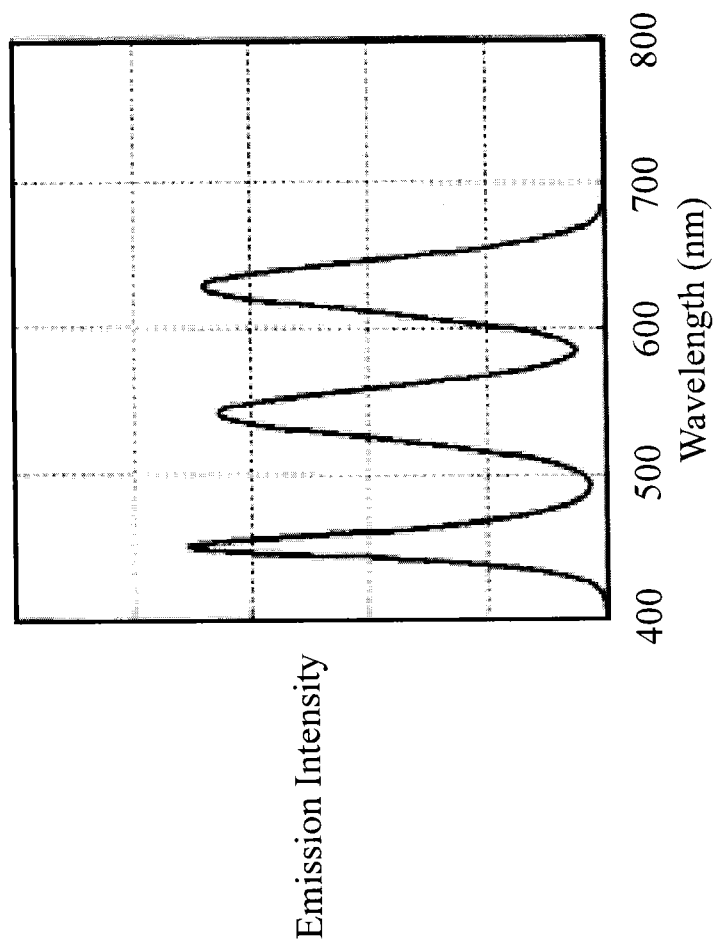
FIG. 4 is an emission spectrum of a light source.

FIG. 4 is an emission spectrum of a light source.

For the three cured films obtained, chromaticity coordinate values (x, y) and a stimulus value (Y) in the CIE colorimetric system in use by a light source having the emission spectrum shown in FIG. 4 were measured. Specifically, the measurements were performed at a pinhole diameter of 5 μm by using a microspectrophotometer (OSP100 manufactured by Olympus Corporation) and the values were calculated as a result of 2 degree observer. Moreover, the thickness of the resulting cured films was measured by using an Alpha-Step IQ produced by KLA-Tencor. The emission spectrum shown in FIG. 4 is one obtained from a light emitting element containing InP/ZnS core-shell type quantum dots produced in accordance with the method disclosed in Example B1 of JP 2011-202148 A. This emission spectrum has a first peak wavelength at 450 nm, a second peak wavelength at 542 nm, and a third peak wavelength at 629 nm, and the half-value width of the first peak wavelength is 20 nm, the half-value width of the second peak wavelength is 40 nm, and the half-value width of the third peak wavelength is 39 nm.

From the measured results, a chromaticity coordinate value y, a stimulus value (Y), and a film thickness (μm) at a chromaticity coordinate value x of 0.680 were determined. The evaluation results are shown in Table 7. It can be said that as the film becomes thinner, it is more likely that a red hue at the higher color purity can be displayed even with thin pixels.

Examples 2 to 4 and Comparative Examples 1 to 4

A chromaticity coordinate value y, a stimulus value (Y), and a film thickness (μm) at a chromaticity coordinate value x of 0.680 were determined in the same manner as Example 1 except that a colored composition shown in Table 7 was used instead of the colored composition (RS-1) in Example 1. The evaluation results are shown in Table 7. In Comparative Examples 1 to 4 in which colored compositions (RS-5) to (RS-8) were used, since the film thickness at which a chromaticity coordinate value x of 0.680 is exhibited is excessively large, the red pixels formed using these colored compositions are unsuitable for the production of a display device being wide in color reproducibility.

Examples 5 to 7 and Comparative Example 5

Three green cured films for evaluation were formed in the same manner as Example 1 except that the colored compositions shown in Table 7 were used instead of the colored composition (RS-1) in Referential Example 1.

For the three cured films obtained, chromaticity coordinate values (x, y) and a stimulus value (Y) in the CIE colorimetric system were measured in the same manner as Example 1. Moreover, the thickness of the resulting cured films was measured by using an Alpha-Step IQ produced by KLA-Tencor. From the measured results, a chromaticity coordinate value x, a stimulus value (Y), and a film thickness (μm) at a chromaticity coordinate value y of 0.710 were determined. The evaluation results are shown in Table 7. It can be said that as the film becomes thinner, it is more likely that a green hue at the higher color purity can be displayed even with thin pixels. In Comparative Example 5 in which colored composition (GS-4) was used, since the film thickness at which a chromaticity coordinate value y of 0.710 is exhibited is excessively large, the green pixels formed using the colored composition (GS-4) are unsuitable for the production of a display device being wide in color reproducibility.

Referential Example 1

Three blue cured films for evaluation were formed in the same manner as Example 1 except that the colored compositions shown in Table 7 were used instead of the colored composition (RS-1) in Referential Example 1.

For the three cured films obtained, chromaticity coordinate values (x, y) and a stimulus value (Y) in the CIE colorimetric system were measured in the same manner as Example 1. Moreover, the thickness of the resulting cured films was measured by using an Alpha-Step IQ produced by KLA-Tencor. From the measured results, a chromaticity coordinate value x, a stimulus value (Y), and a film thickness (μm) at a chromaticity coordinate value y of 0.080 were determined. The evaluation results are shown in Table 7.

TABLE 7

| | Colored Composition | Chromatic Property | | | Film Thickness (μm) |
|---|---|---|---|---|---|
| | | x | y | Y | |
| Example 1 | RS-1 | 0.680 | 0.318 | 28.1 | 2.3 |
| Example 2 | RS-2 | 0.680 | 0.318 | 28.7 | 2.4 |
| Example 3 | RS-3 | 0.680 | 0.318 | 27.3 | 2.8 |
| Example 4 | RS-4 | 0.680 | 0.318 | 27.7 | 3.0 |
| Comparative Example 1 | RS-5 | 0.680 | 0.318 | 20.1 | 17.5 |
| Comparative Example 2 | RS-6 | 0.680 | 0.318 | 24.8 | 4.8 |
| Comparative Example 3 | RS-7 | 0.680 | 0.318 | 24.2 | 8.4 |
| Comparative Example 4 | RS-8 | 0.680 | 0.318 | 25.4 | 4.3 |
| Example 5 | GS-1 | 0.210 | 0.710 | 49.2 | 2.1 |
| Example 6 | GS-2 | 0.210 | 0.710 | 50.0 | 2.5 |
| Example 7 | GS-3 | 0.210 | 0.710 | 52.0 | 2.8 |
| Comparative Example 5 | GS-4 | 0.210 | 0.710 | 56.2 | 3.1 |
| Referential Example 1 | BS-1 | 0.148 | 0.080 | 13.8 | 2.6 |

Example 101

Preparation and Evaluation of Color Filter

Red colored composition (RS-1) was applied with a slit die coater to a glass substrate having a black matrix formed thereon and then prebaked for 2 minutes with a hot plate at 90° C., thereby forming a coating film. Subsequently, after cooling the substrate with the coating film formed thereon to room temperature, the coating film was irradiated with radiation containing wavelengths of 365 nm, 405 nm, and 436 nm in an exposure dose of 1,000 J/m2 with a high pressure mercury lamp through a striped photomask. After performing alkali development, the substrate was rinsed with ultrapure water and then subjected to post-baking for 20 minutes at 230° C., so that a red striped pixel having a film thickness of 2.3 μm was formed on the substrate. The film thickness of 2.3 μm corresponds to the thickness at the chromaticity coordinate value x of 0.680 that was determined in Example 1.

Subsequently, a green striped pixel having a film thickness of 2.5 μm was formed next to the red striped form pixel in the same manner using green colored composition (GS-2). Moreover, a blue striped pixel having a film thickness of 2.6 μm adjoining the red and the green pixels was formed in the same manner using blue colored composition (BS-1). The film thickness of 2.5 μm of a green striped pixel corresponds to the thickness at the chromaticity coordinate value y of 0.710 that was determined in Example 6 and the film thickness of 2.6 μm of a blue striped pixel corresponds to the thickness at the chromaticity coordinate value y of 0.080 that was determined in Referential Example 1.

Subsequently, on the pixel composed of three colors, i.e., red, green and blue, a protective film was formed using a photocurable resin composition. Thus, a color filter substrate having the red pixel and the green pixel of the present invention was prepared. As a result of irradiating the obtained color filter with light having the emission spectrum shown in FIG. 4 as a light source, a good white display property was exhibited.

Examples 102 to 107

Color filter substrates were prepared and evaluated in the same manner as in Example 101 except that green and blue striped pixels were formed in Example 101 in the combinations of a red colored composition, a green colored composition, and a blue colored composition shown in Table 8. The evaluation results are shown in Table 8.

TABLE 8

| | | Example | | | | | | |
|---|---|---|---|---|---|---|---|---|
| | | 101 | 102 | 103 | 104 | 105 | 106 | 107 |
| Red Colored Composition | | RS-1 | RS-2 | RS-3 | RS-4 | RS-1 | RS-1 | RS-1 |
| Green Colored Composition | | GS-2 | GS-2 | GS-2 | GS-2 | GS-1 | GS-2 | GS-3 |
| Blue Colored Composition | | BS-1 | BS-1 | BS-1 | BS-1 | BS-1 | BS-1 | BS-1 |
| Red Pixel | Rx | 0.680 | 0.680 | 0.680 | 0.680 | 0.680 | 0.680 | 0.680 |
| | Ry | 0.318 | 0.318 | 0.318 | 0.318 | 0.318 | 0.318 | 0.318 |
| | Y | 28.1 | 28.7 | 27.3 | 27.7 | 28.1 | 28.1 | 28.1 |
| | Film Thickness (μm) | 2.3 | 2.4 | 2.8 | 3.0 | 2.3 | 2.3 | 2.3 |
| Green Pixel | Gx | 0.210 | 0.210 | 0.210 | 0.210 | 0.210 | 0.210 | 0.210 |
| | Gy | 0.710 | 0.710 | 0.710 | 0.710 | 0.710 | 0.710 | 0.710 |
| | Y | 50.0 | 50.0 | 50.0 | 50.0 | 49.2 | 50.0 | 52.0 |

TABLE 8-continued

| | | Example | | | | | | |
|---|---|---|---|---|---|---|---|---|
| | | 101 | 102 | 103 | 104 | 105 | 106 | 107 |
| | Film Thickness (μm) | 2.5 | 2.5 | 2.5 | 2.5 | 2.1 | 2.5 | 2.8 |
| Blue Pixel | Bx | 0.148 | 0.148 | 0.148 | 0.148 | 0.148 | 0.148 | 0.148 |
| | By | 0.080 | 0.080 | 0.080 | 0.080 | 0.080 | 0.080 | 0.080 |
| | Y | 13.8 | 13.8 | 13.8 | 13.8 | 13.8 | 13.8 | 13.8 |
| | Film Thickness (μm) | 2.6 | 2.6 | 2.6 | 2.6 | 2.6 | 2.6 | 2.6 |
| White Chromaticity | Wx | 0.306 | 0.303 | 0.302 | 0.288 | 0.303 | 0.303 | 0.302 |
| | Wy | 0.276 | 0.277 | 0.277 | 0.276 | 0.276 | 0.277 | 0.281 |
| | Y | 30.6 | 30.6 | 30.5 | 29.3 | 30.4 | 30.7 | 31.3 |

What is claimed is:

1. A display device comprising:
a color filter having at least one of:
a red pixel that has a chromaticity coordinate in the CIE colorimetric system in use by a light emitting element containing quantum dots as a light source, the chromaticity coordinate satisfying 0.670≤x≤0.680; and has a film thickness of 3.0 μm or less, and
a green pixel that has a chromaticity coordinate in the CIE colorimetric system in use by the light emitting element containing quantum dots as a light source, the chromaticity coordinate satisfying 0.690≤y≤0.710; and has a film thickness of 3.0 μm or less; and
the light emitting element containing quantum dots.

2. The display device according to claim 1, wherein said color filter has a red pixel which comprises at least one red colorant selected from the group consisting of pigments having a diketopyrrolopyrrole skeleton, C. I. Pigment Red 242, C. I. Pigment Red 166, and cyanine compounds.

3. The display device according to claim 2, wherein the pigment having the diketopyrrolopyrrole skeleton comprises at least one selected from the group consisting of C. I. Pigment Red 254, C. I. Pigment Red 255, C. I. Pigment Red 264, and a compound represented by the following formula (1)

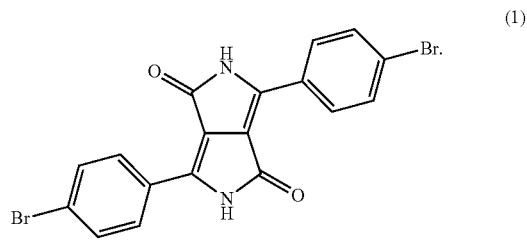 [SMILES: O=C1NC(c2ccc(Br)cc2)=C2C(=O)NC(c3ccc(Br)cc3)=C12]

(1)

4. The display device according to claim 1, wherein said color filter has a green pixel which comprises at least one green colorant selected from the group consisting of a halogenated copper phthalocyanine pigment and a halogenated zinc phthalocyanine pigment.

5. The display device according to claim 4, wherein the halogenated copper phthalocyanine pigment is C. I. Pigment Green 7.

* * * * *